US012757799B2

(12) United States Patent
Jhaveri et al.

(10) Patent No.: US 12,757,799 B2
(45) Date of Patent: Oct. 6, 2026

(54) DIAMOND PIXEL ARRAY WITH OFFSET MEMORY

(71) Applicant: Texas Instruments Incorporated, Dallas, TX (US)

(72) Inventors: Harsh Jhaveri, Wylie, TX (US); Ryan Savage, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 341 days.

(21) Appl. No.: 18/641,357

(22) Filed: Apr. 20, 2024

(65) Prior Publication Data

US 2025/0329696 A1 Oct. 23, 2025

(51) Int. Cl.

*H10W 90/00* (2026.01)
*H10B 10/00* (2023.01)
*H10H 20/855* (2025.01)

(52) U.S. Cl.

CPC ............ *H10W 90/00* (2026.01); *H10B 10/12* (2023.02); *H10H 20/855* (2025.01)

(58) Field of Classification Search

CPC ....... H10W 90/00; H10B 10/12; H10B 10/18; H10H 20/855; H10H 29/32; G02B 26/0841

See application file for complete search history.

(56) References Cited

U.S. PATENT DOCUMENTS

| | | | | |
|---|---|---|---|---|
| 11,997,430 B2 * | 5/2024 | Robb | ........................ | G11C 8/08 |
| 2022/0224868 A1 * | 7/2022 | Robb | ................. | G02B 26/0816 |

* cited by examiner

*Primary Examiner* — J. E. Schoenholtz

(74) *Attorney, Agent, or Firm* — Michael T. Gabrik; Frank D. Cimino

(57) ABSTRACT

In one example, an apparatus includes a substrate, an array of memory cells on the substrate, and an array of pixels over the array of memory cells. The array of memory cells is in a grid pattern. The array of pixels is in a diamond pattern that is oriented at an angle relative to the grid pattern of the array of memory cells. Each pixel of the array of pixels overlaps respective portions of at least two memory cells of the array of memory cells. Each pixel of the array of pixels is electrically connected to an output of a respective memory cell of the array of memory cells.

20 Claims, 17 Drawing Sheets

DIAMOND PIXEL ARRAY WITH OFFSET MEMORY

BACKGROUND

Spatial light modulator devices are used in various technologies and operate, as the name suggests, to spatially modulate an incident beam of light. Some spatial light modulator devices include an array of movable pixels that can change the intensity or phase of an incident beam of light. Spatial light modulator devices are used in, for example, high dynamic range cinema, low cost optical projection, light detection and ranging systems, high volume optical switching (e.g., used in telecom or server farms), microscopy, spectroscopy, adaptive optics, holographic displays, automotive projection (e.g. smart headlights, heads-up display (HUD), transparent window displays, interior lighting, and ground projection), near-eye displays, digital direct imaging, 3D printing, 3D-scanning, other projection displays, and other light control applications.

SUMMARY

In one example, an apparatus includes a substrate, an array of memory cells on the substrate, and an array of pixels over the array of memory cells. The array of memory cells is in a grid pattern. The array of pixels is in a diamond pattern that is oriented at an angle relative to the grid pattern of the array of memory cells. Each pixel of the array of pixels overlaps respective portions of at least two memory cells of the array of memory cells. Each pixel of the array of pixels is electrically connected to an output of a respective memory cell of the array of memory cells.

In another example, an apparatus includes a substrate, an array of memory cells on the substrate, and an array of pixels over the array of memory cells. The array of memory cells is in a grid pattern having orthogonal rows and columns. The array of pixels is in a diamond pattern that is oriented at an angle relative to the grid pattern of the array of memory cells. Each pixel of the array of pixels is electrically connected to an output of a respective memory cell of the array of memory cells. Each pixel of the array of pixels shares, with a respective adjacent pixel of the array of pixels, an electrical connection to a block step address. A first pixel of the array of pixels has a first positional offset relative to its respective memory cell of the array of memory cells. A second pixel of the array of pixels has a second positional offset relative to its respective memory cell of the array of memory cells. The first and second positional offsets are different from one another.

In another example, an apparatus includes a substrate, an array of memory cells on the substrate, and an array of pixels over the array of memory cells. The array of memory cells is in a grid pattern having orthogonal rows and columns. The array of pixels is in a diamond pattern that is oriented at an angle relative to the grid pattern of the array of memory cells. Each pixel of the array of pixels overlaps respective portions of at least two memory cells of the array of memory cells. Each pixel of the array of pixels is electrically connected to an output of a respective memory cell of the array of memory cells. A first pixel of the array of pixels has a first positional offset relative to its respective memory cell of the array of memory cells. A second pixel of the array of pixels has a second positional offset relative to its respective memory cell of the array of memory cells. The first and second positional offsets are different from one another.

BRIEF DESCRIPTION OF THE DRAWINGS

The same reference numbers or other reference designators are used in the drawings to designate the same or similar (functionally and/or structurally) features. The figures are not necessarily drawn to scale.

DETAILED DESCRIPTION

Disclosed herein are various spatial light modulator devices that have micromechanical electrostatic pixels that can modulate an incident beam of light (e.g., in terms of phase or intensity). As described further below, the use of an array of pixels in a diamond pattern over an array of memory cells in an offset grid pattern can have certain technical advantages including, for example, increasing pixel density for a given surface area without compromising performance and reliability.

Certain examples facilitate increasing or otherwise optimizing pixel density by sharing certain circuitry between adjacent pixels. For example, an array of pixels may be subdivided into multiple 2×2 subarrays in which each subarray has two pairs of adjacent pixels, with each pair sharing certain circuitry. The circuitry shared between paired pixels can include, for example, wells, moats, substrate contacts, or other forms of electrical routing. In some examples, the use of shared circuitry may reduce (e.g., by half) the total surface area required for such circuitry, thereby providing additional design options for increasing pixel density.

In some examples, the density of pixels over a given surface area may be increased in part by decreasing the pixel pitch, where "pixel pitch" in this context refers to the distance between like features of adjacent pixels. Decreasing pixel pitch can present certain design challenges. For example, in some implementations, control circuitry may require a certain amount of surface area per pixel and thereby constrain how much a pixel pitch can be reduced. Certain examples disclosed herein combine a reduction in pixel pitch with shared circuitry and certain diamond pattern arrangements of pixels, thereby facilitating higher pixel density. Certain examples can have a diagonal pixel pitch of less than five micrometers, where the diagonal pixel pitch is measured along an axis aligned with a diamond pattern arrangement of pixels.

In some examples, decreasing pixel pitch while increasing pixel density can result in increasing the gap density between pixels for a given surface area, where "gap density" is defined as the percentage of an overall surface area attributable to gaps between adjacent pixels. Certain examples disclosed herein strategically minimize the amount of reflective material that might be exposed in the gaps between pixels, which may result in improved optical performance by minimizing stray reflections.

Certain examples disclosed herein may include one or more layers having certain space-filling or "dummy" patterns that are strategically positioned to improve the planarity of an overlaying layer (e.g., a hinge layer or a micromirror layer). Improving the planarity of a given layer may improve optical performance of an SLM device (e.g., by enhancing planarity of a micromirror pixel).

Figure 1A:
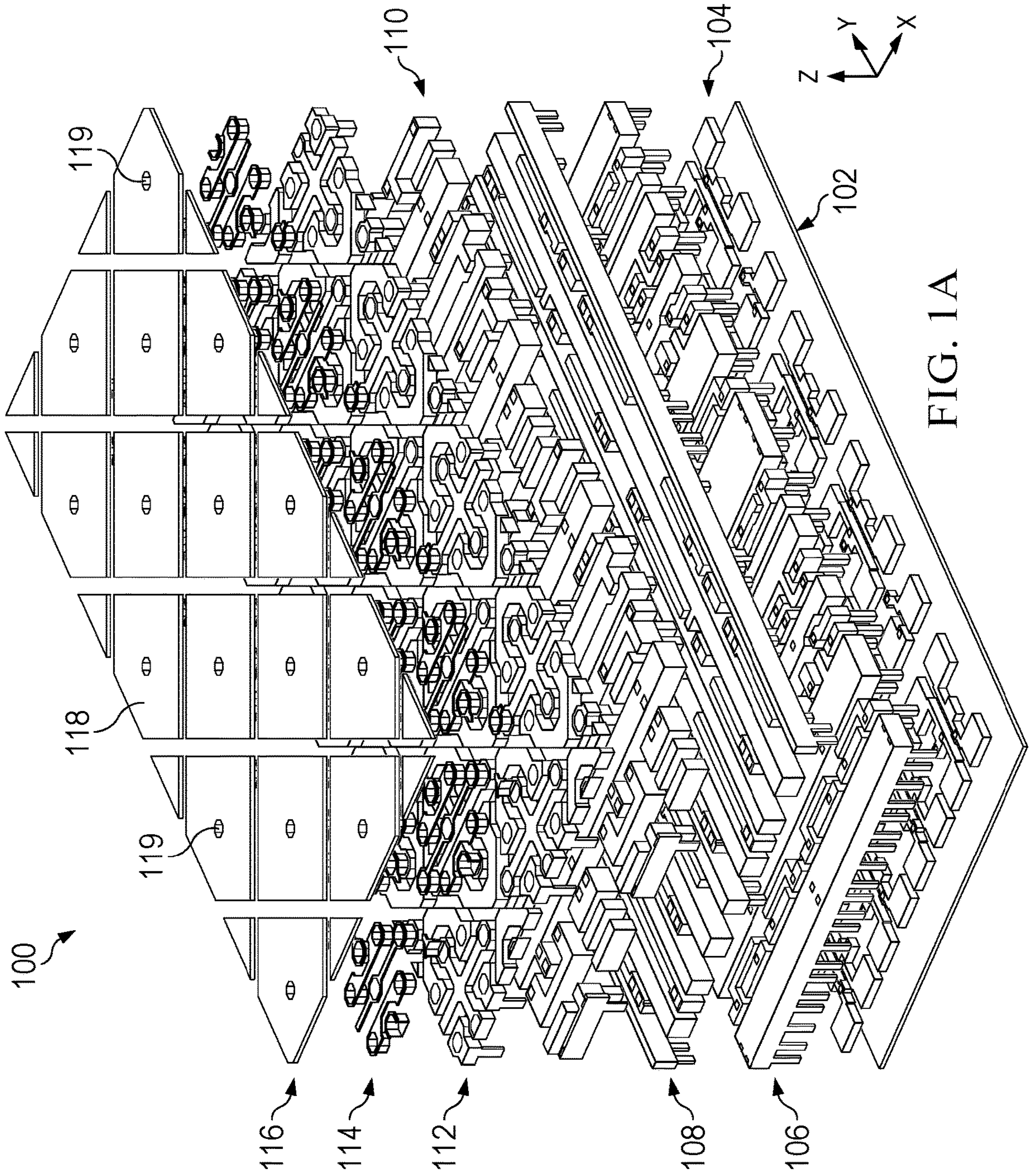
FIG. 1A is an exploded oblique view of a portion of an example spatial light modulator (SLM) device.
Figure 1B:
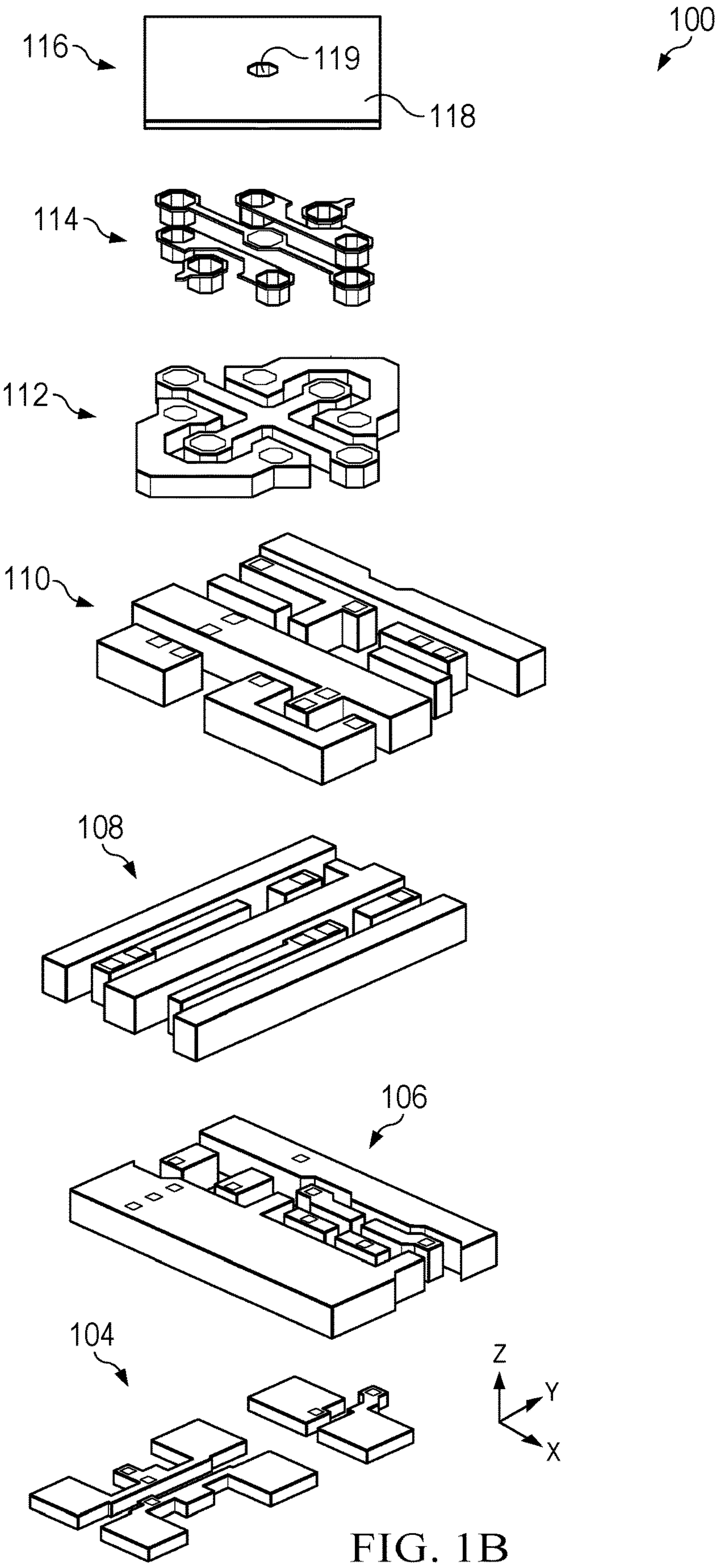
FIG. 1B is an exploded view of a single pixel of the example SLM device of FIG. 1A.

FIG. 1A is an exploded oblique view of a portion of an example SLM device 100. SLM device 100 includes a substrate 102, a memory layer 104 on the substrate 102, a metal-1 layer 106 on the memory layer 104, a metal-2 layer 108 on the metal-1 layer 106, a metal-3 layer 110 on the metal-2 layer 108, a metal-4 layer 112 on the metal-3 layer 110, a hinge layer 114 on the metal-4 layer 112, and a mirror layer 116 on the hinge layer 114. FIG. 1B is an exploded view of a single pixel 118 of the example SLM device 100. The memory layer 104 and the four overlying metal layers 106-112 may each be encapsulated within nonconductive material (e.g., an oxide) (not explicitly shown) formed on substrate 102.

Figure 4:
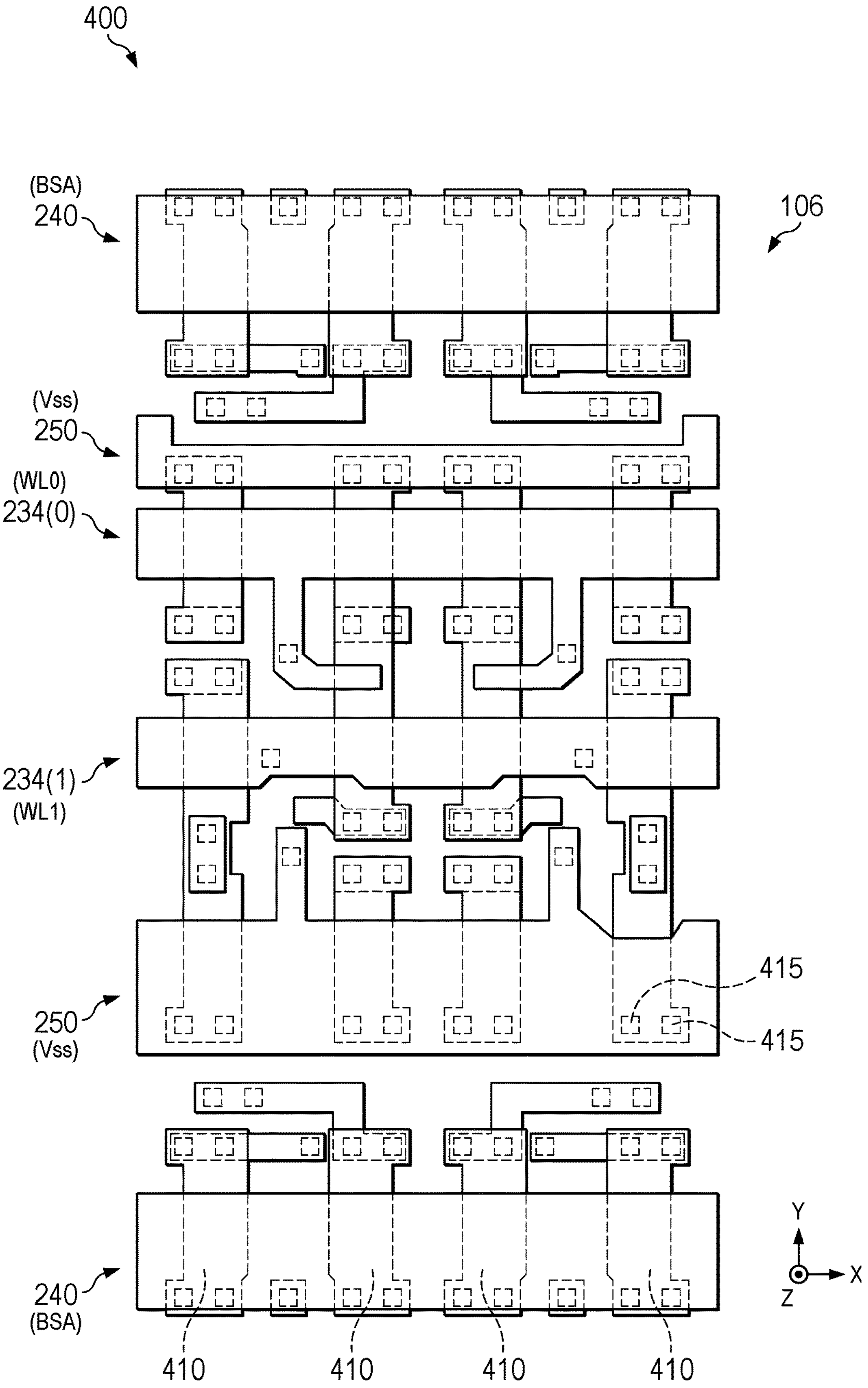
FIG. 4 is a view of a portion of metal-1 layer and its alignment relative to an underlying moat region.
Figure 5:
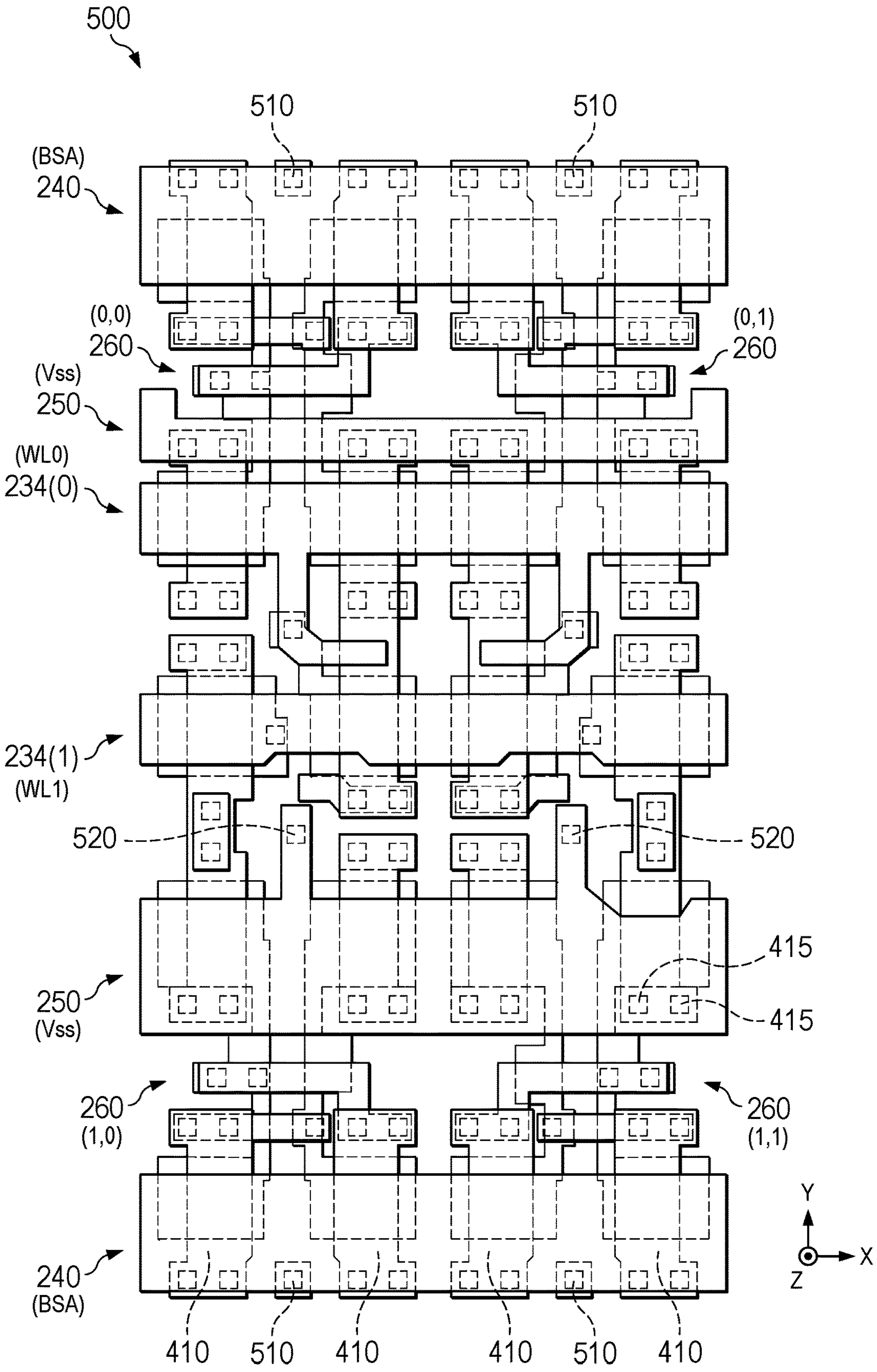
FIG. 5 is an overlay view showing an example alignment of the metal-1 layer shown in FIG. 4 relative to the memory layer shown in FIG. 3.

Each layer 104-114 may include multiple sublayers and one or more additional layers can be formed between each one of the illustrated layers 104-114. For example, FIGS. 1A and 1B illustrate each layer 104-116 as having a corresponding via sublayer in which multiple vias extend vertically (e.g., along the z-axis shown) and provide an electrical interconnection to a respective underlying layer, Memory layer 104 may be representative of a polysilicon gate layer for the transistors (Q1-Q5) of the memory cell 260 shown in FIG. 2. In other words, memory layer 104 may be one of multiple layers used in forming transistors (Q1-Q5), such that each memory cell 260 may have other implanted regions in the substrate 102 in addition to memory layer 104. For example, FIGS. 4 and 5 illustrate an example implanted moat region 410 with dashed lines. Additional detail regarding memory layer 104 is also described below with reference to FIG. 3.

Metal-1 layer 106 includes conductive patterns that can be used to route electrical signals to and from adjacent layers (e.g., memory layer 104 and metal-2 layer 108). As explained further with reference to FIGS. 2 and 4-5, for example, the electrical signals may be transmitted by respective conductive patterns within metal-1 layer 106 associated with a word-line 234, a block step address (BSA) power supply 240, or a source power supply (Vss) 250 (e.g., ground).

Metal-2 layer 108 includes multiple conductive patterns that can be used to route electrical signals to and from adjacent layers (e.g., metal-1 layer 104 and metal-3 layer 110). FIG. 7 shows an overlay view of example electrical interconnections between metal-1 layer 108 and metal-2 layer 108. As explained further with reference to FIGS. 2 and 6, certain electrical signals may be transmitted by respective conductive patterns within metal-2 associated with various bit-lines (e.g., bit-line 230 of FIG. 2 or BITS 614, 622 of FIG. 6). Other electrical signals associated with Vss or BSA may be transmitted by respective conductive patterns with metal-2 layer, as explained further with reference to FIG. 6.

Metal-3 layer 110 includes multiple conductive patterns that can be used to route electrical signals to and from adjacent layers (e.g., metal-2 layer 108 and metal-4 layer 112). As explained further with reference to FIG. 8, conductive vias electrically connected to metal-3 layer 110 may extend toward adjacent layers in directions along the z-axis. Example vias interconnecting metal-3 layer 110 and metal-4 layer 112 are also described with reference to FIG. 10.

Metal-4 layer 112 includes rotationally symmetric patterns that can serve as a substantially planar base for pixel superstructure formed outwardly therefrom, as described with reference to FIGS. 9-16. Metal-4 layer 112 includes multiple conductive patterns that can be used to route electrical signals to and from adjacent layers (e.g., metal-3 layer 110 and hinge layer 114. Additional detail regarding metal-4 layer 112 is described with reference to FIGS. 9 and 10.

Hinge layer 114 includes multiple conductive patterns that can be used to route electrical signals to and from adjacent layers (e.g., metal-4 layer 112 and mirror layer 116). For example, hinge layer 114 can include hinge posts physically and electrically coupling hinge layer 114 to metal-4 layer 112. Hinge layer 114 also includes rotationally symmetric patterns that can be used to form certain pixel superstructures. For example, hinge layer 114 can contain the torsional hinges and spring tips described with reference to FIG. 11, which interoperate to enable controlled mechanical motion of a respective pixel 118 responsive to electrostatic potential (e.g., between a given micromirror of a respective pixel 118 and its raised address electrodes 1125 of FIG. 11). To enable such motion, an air gap may separate respective portions of hinge layer 114 from respective portions of metal-4 layer 112 and from respective portions of mirror layer 116, such that the torsion hinges of hinge layer 114 are suspended over metal-4 layer 112. Additional detail regarding hinge layer 114 is described with reference to FIG. 11.

Mirror layer 116 also includes rotationally symmetric patterns that can be used to form micromirror pixels 118. Each micromirror of a respective pixel 118 of mirror layer 116 includes a respective mirror post (e.g., mirror posts 119)

physically and conductively coupling the pixel 118 to corresponding underlying superstructure of hinge layer 114.

The pixels 118 of mirror layer 116 may be arranged in a diamond pattern relative to the peripheral edges of the array. As shown more clearly in FIG. 12, the diamond pattern of pixels 118 is orientated at an angle relative to a grid pattern of the array of underlying memory cells 260 of memory layer 104, in which the grid pattern arranges memory cells 260 in orthogonal rows and columns.

Pixels 118 can include an array of thousands or even millions of individually controllable pixels, for example. Each pixel 118 can selectively modulate light (e.g., in terms of phase, intensity, or angle of transmission) depending on electrical signals applied to the pixel 118, thereby spatially modulating a beam of light transmitted by SLM device 100. In some examples, pixels 118 can be individually actuated in either an on or off state. For example, SLM device 100 may be configured to provide a rapid sequence of electrical signals that sequentially controls whether each pixel 118 of SLM device 100 is tilted toward (e.g., in an on state) or away (e.g., in an off state) from an optical element (e.g., a lens) used in focusing light modulated by SLM device 100. SLM device 100 may incorporate a wide range of technologies including, for example, a liquid crystal device (LCD), liquid crystal on silicon (LCOS), or a microelectromechanical system (MEMS).

In operation, circuitry (not shown) in substrate 102 applies electric signals to memory layer 104, in accordance with a sequence of programmed display states (e.g., on or off) for pixels 118 of SLM device 100. In some examples, the circuitry also applies voltage bias signals to generate electrostatic potential sufficient to cause pixels 118 to be positioned in accordance with a programmed display state. Example timing sequences for electric signals that may be used to control micromirror positions are described in co-owned U.S. Pat. No. 7,692,841, filed Jul. 31, 2007, entitled "System and Method for Regulating Micromirror Position," and U.S. Pat. No. 7,884,988, filed Jul. 8, 2004, entitled "Supplemental Reset Pulse," which are incorporated by reference in their entirety.

Figure 2:
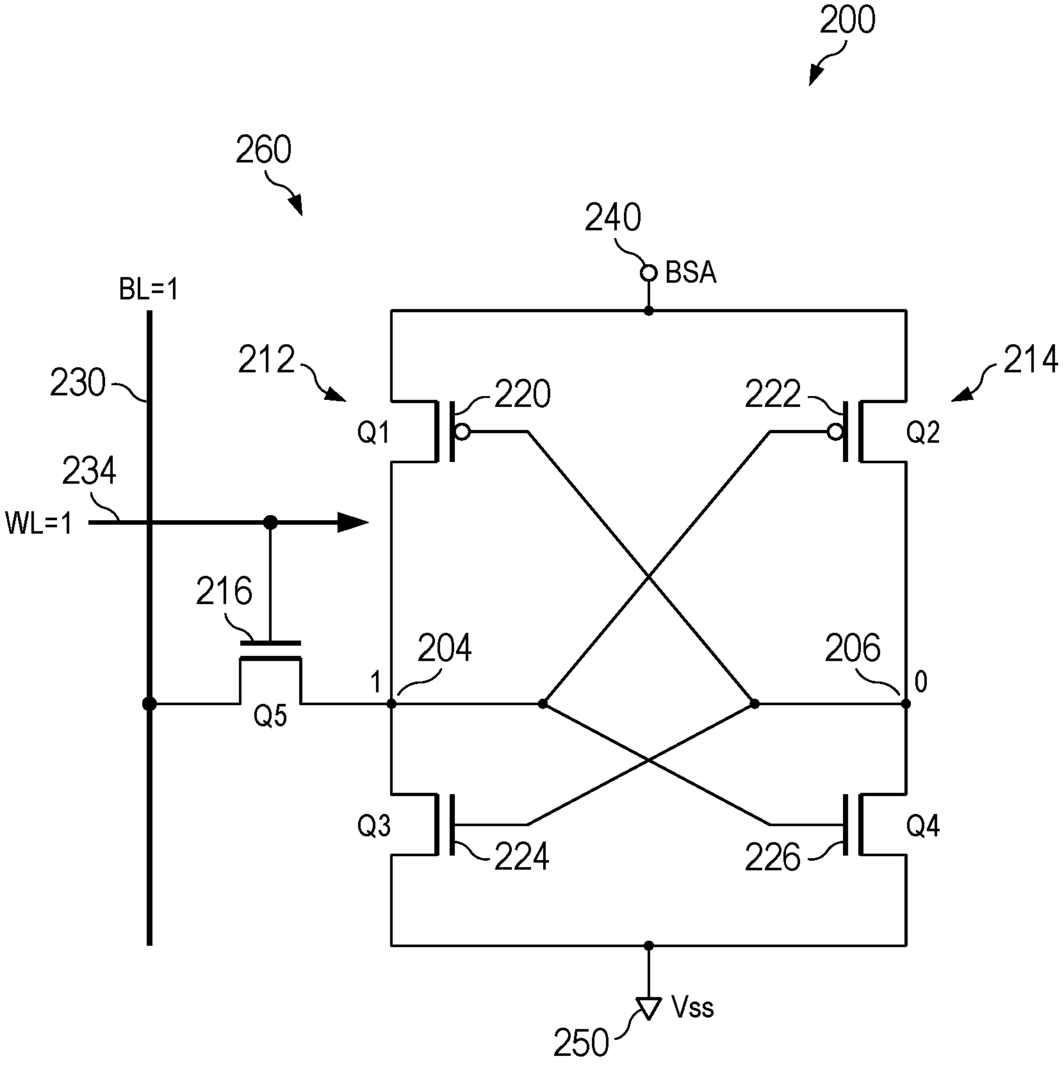
FIG. 2 is a portion of an example schematic for circuitry that may be used in forming a five-transistor memory cell included within the SLM device of FIG. 1A.

FIG. 2 is a portion of an example schematic 200 for circuitry that may be used in forming a memory cell 260 within memory layer 104. Memory layer 104 may include a matrix of such memory cells 260 fabricated in an integrated circuit, in which address decoding in the circuit allows access to each memory cell 260 for read/write functions. Such a matrix of memory cells may collectively form static random access memory (SRAM). Some SRAM memory cells use active feedback from cross-coupled inverters in the form of a latch to store or "latch" a bit of information. SRAM memory cells can be arranged in rows or columns, which can facilitate simultaneously reading or writing blocks of data such as words or bytes.

Memory cell 260 is operable to store a data bit state. For example, the bit can be stored in first or second latch nodes 204 and 206, respectively, having a high or "1" state and a low or "0" state, respectively. As illustrated, memory cell 260 includes five transistors Q1 220, Q2 222, Q3 224, Q4 226, and Q5 216, in which two of the transistors (Q1 220 Q2 222) are cross-coupled inventers 212 and 214, respectively. Cross-coupled inverters 212, 214 of memory cell 260 are connected to a block step address (BSA) power supply 240 and a source power supply (Vss) 250 (e.g., ground). Transistor Q5 216 can operate as a word-line pass transistor to read and write the data bit between the cross-coupled inventers 212, 214 and a bit-line (e.g., bit-line 230), when enabled by word-line 234.

Each of the five transistors Q1 220, Q2 222, Q3 224, Q4 226, and Q5 216 may be configured to enable both higher-voltage and lower-voltage operations. To accommodate both higher-voltage and lower-voltage operations, BSA 240 can be a switchable power supply. For example, BSA 240 may be stepped down to a lower-voltage level (e.g., 1.8V) to facilitate a first operational mode (e.g., Vdd), such as a write operation to memory cell 260, in which BSA 240 operates to supply voltage to memory cell 260. BSA 240 may be stepped up to a higher-voltage level (e.g., 10V) to facilitate a second operational mode (e.g., Voffset), such as controlling mechanical operation of a corresponding pixel 118 electrically coupled to memory cell 260, based on the data previously written to the memory cell 260. The sequential use of lower-voltage and higher-voltage operational modes may be used, for example, to sequentially control the spatial light modulation of corresponding pixels 118.

The use of a switchable power supply with at least 8.2V difference between lower and higher voltage levels (e.g., 1.8V at the lower-voltage level and 10V at the higher-voltage level) may give rise to certain design considerations. Certain examples may constrain a five-transistor or "5T" memory cell 260 within a surface area that enables matching memory cell density to pixel density on a one-to-one ratio. For example, a given 5T memory cell 260 may be constrained to a 20 $\mu m^2$ surface area to accommodate such a one-to-one ratio. Certain examples may also apply a duty cycle for switching between higher-voltage and lower-voltage levels, in which the lower-voltage level (e.g., 1.8V) is applied for a longer portion of the duty cycle than the higher-voltage level (e.g., 10V). For example, the lower-voltage level may be used for 90% of a duty cycle (e.g., 27 microseconds of a 30 microseconds duty cycle) with the higher-voltage used the remaining 10% of the same duty cycle (e.g., 3 microseconds of the same 30 microseconds duty cycle).

Fabricating transistors (Q1-Q5) that enable both lower-voltage and higher-voltage operation and that collectively fit within a maximum surface area may require semiconductor processing techniques that are subject to certain minimum space constraints. For example, the combination of the above example design constraints (e.g., a 20 $\mu m^2$ maximum surface area for each memory cell 260 to accommodate the aforementioned one-to-one ratio, together with 90% to 10% duty cycle ratio for supplying a higher-voltage level and lower-voltage level, respectively) may be satisfied, at least in part, by optimizing gate widths and lengths of each transistor in the 5T memory cell 260. Certain space constraints associated with fabricating high-voltage capable transistors may further challenge efforts to reduce the dimensional pitch of pixels 118, particularly if memory cells 260 are each configured to control the operation of a respective pixel 118 on a one-to-one basis. Applying asymmetrical offsets in the alignment between pixels 118 and their respective memory cells 260 may facilitate accommodating smaller pixel pitches, such as, for example, a square pixel that has a diagonal of 4.5 microns.

Figure 3:
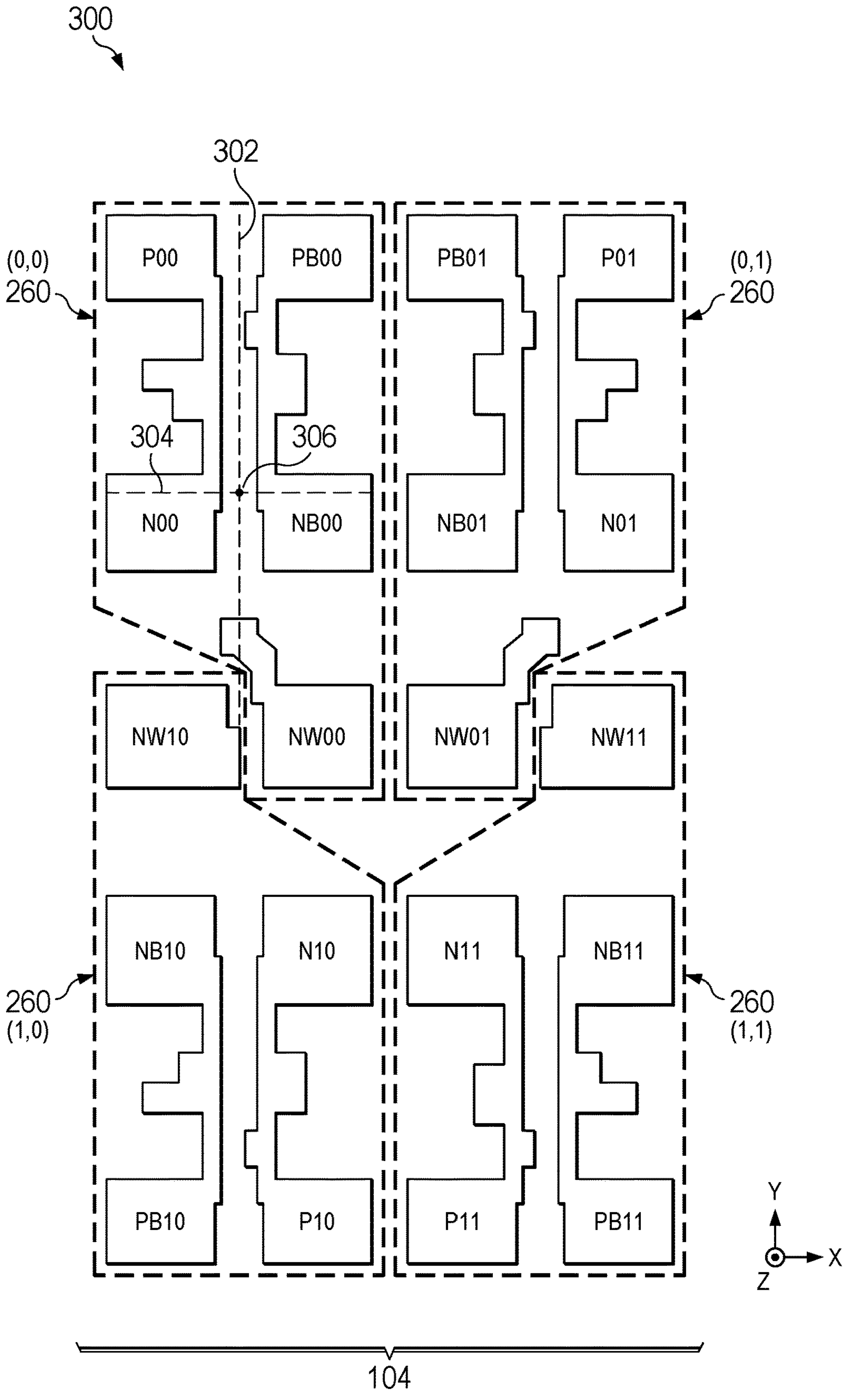
FIG. 3 is a view of a portion of a memory layer of the SLM device of FIG. 1A.

FIG. 3 is a view 300 of a portion of memory layer 104. The illustrated portion of memory layer 104 includes respective portions of four memory cells 260 in a 2×2 array, in which each memory cell 260 is represented by a respective one of the array coordinates (0,0), (1,0), (0,1), and (1,1), where the first number in the parenthetical represents the row number in the array (counting rows from top to bottom) and the second number represents the column in the array (counting columns from left to right). In this example, each memory cell 260 is configured to control the operation of a respective pixel 118 on a one-to-one basis. Although a 2×2 array is used in this example for explanatory purposes, an n-by-m array of any suitable dimensions may be used. Each memory cell 260 is positioned on a grid pattern having orthogonal rows and columns, in which the array columns are parallel to one another and the illustrated y-axis, and the array rows are parallel to one another and the illustrated x-axis.

Memory cell 260 (0,0) (shown in view 300 in the upper-left quadrant of the illustrated 2×2 array) includes five transistors, represented in FIG. 3 as P00, PB00, N00, NB00, and NW00. Memory cell 260 (0,1) (shown in view 300 in the upper-right quadrant of the illustrated 2×2 array) includes five transistors, represented in FIG. 3 as P01, PB01, N01, NB01, and NW01. Memory cell 260 (1,0) (shown in view 300 in the lower-left quadrant of the illustrated 2×2 array) includes five transistors, represented in FIG. 3 as P10, PB10, N10, NB10, and NW10. Memory cell 260 (1,1) (shown in view 300 in the lower-right quadrant of the illustrated 2×2 array) includes five transistors, represented in FIG. 3 as P11, PB11, N11, NB11, and NW11. View 300 shows transistors NW10, NW00, NW01 and NW11 arranged in a horizontal line parallel to the illustrated x-axis, in which the same row of memory layer 104 contains a respective transistor of four distinct memory cells 260, with each position along the row occupied by an NW() transistor of a distinct respective memory cell 260**.

The layout of the transistors (Q1-Q5) in each memory cell 260 relative to those of adjacent memory cells 260 can be designed to maximize the sharing of well, moat, contact and minimize gaps. For example, in a 5T design, in which each 2×2 array of memory cells 260 include 5*4=20 total transistors, the 12 N-type transistors can be positioned close together and the 8 P-type transistors can be positioned close together. As shown in FIG. 3, for example, 12 N-type transistors are grouped toward the middle of the 2×2 array of memory cells 260. The top and bottom of the 2×2 array of memory cells 260 includes a respective row of four P-type memory cells, such that adjacent 2×2 arrays of memory cells 260 will have 8 P-type transistors positioned close to one another. Grouping P-type transistors together in clusters and grouping N-type together in clusters can optimize corresponding electrical routing by ensuring a safe distance between high-voltage lines used for micromirror operation, while minimizing the surface area required for the five transistors of each pixel 118. Example electrical routing that may be used is subsequently described with reference to FIGS. 4 through 8. In some examples, clustering transistors of memory cells 260 based in polarity may also facilitate sharing substrate contacts, thereby providing the same electrical potential between adjacent memory cells 260.

In the 2×2 array of memory cells 260 shown in FIG. 3, the center of each memory cell 260 shown in view 300 is not rotationally symmetric. The asymmetry is due in part to each memory cell 260 in the 2×2 array having a fifth transistor positioned along a central row of transistors. In instances where the outermost boundary of each memory cell 260 forms a shape that is not rotationally symmetric, the "center" of a memory cell 260 as that term is used herein refers to the intersection of the two lines bisecting the width and length of the smallest rectangle that can be drawn that completely frames all the transistors of a given the memory cell 260. For memory cell 260 (0,0), for example, the center point 306 is shown as the intersection of horizontal bisection 304 and vertical bisection 302. As explained subsequently, each pixel 118 may have a respective micromirror having a center that is offset from a respective center of its underlying memory cell 260.

While each memory cell 260 may itself by rotationally asymmetric, there may exist certain symmetries between adjacent memory cells. As shown in FIG. 3, for example, memory cell 260 (0,0) and memory cell 260 (0,1) may be symmetric with each other. Similarly, memory cell 260 (1,0) and memory cell 260 (1,1) may be symmetric with each other. In addition, memory cell (0,0) and memory cell 260 (1,0) may be rotationally symmetric with each other. Similarly, memory cell (0,1) and memory cell 260 (1,1) may be rotationally symmetric with each other.

FIG. 4 is a view 400 of a portion of metal-1 layer 106 and its alignment relative to an underlying moat region 410 (shown in FIG. 4 with dashed lines). The moat region 410 has a pattern defining an area within the shallow trench isolation (STI) region of the respective transistors (Q1-Q5) of a given memory cell 260 of memory layer 104. In some examples, the moat region 410 defines a pattern where doped silicon exists at a surface of substrate 102. The moat region 410 includes vias 415 extending vertically inward therefrom. Each via 415 of the moat region 410 provides a respective electrical connection to a respective underlying layer (not explicitly shown) within substrate 102.

Metal-1 layer 106 is over memory layer 104 shown in view 300 of FIG. 3. BSA 240 has two electrically-connected lines formed along respective horizontal axis (parallel to the x-axis shown) at the top and bottom of view 400. Vss 250 has two electrically-connected lines formed along respective horizontal axis (parallel to the y-axis shown) that are both between the two illustrated lines supplying BSA 240. Two electrically isolated word-lines 234(0) (WL0) and 234(1) (WL1) are formed along respective horizontal axis (parallel to the y-axis shown) that are both between the two horizontal lines used to supply Vss 250.

The example metallic routing shown in FIG. 4 can be arranged in a manner that puts as much of the routing as possible under pixels 118, thereby minimizing the presence of metal between pixels 118. This may be achieved, at least in part, by the sharing of circuitry between a pair of adjacent pixels. The circuitry shared between paired pixels can include, for example, certain moat features and electrical interconnections thereto shown in FIG. 4 with dashed lines. Among other technical advantages, the minimizing of metallic routing between pixels 118 can improve contrast achieved in certain display applications of spatial light modulator device 100 (e.g., by minimizing stray reflections transmitted from routing exposed by gaps between pixels 118).

FIG. 5 is an overlay view 500 of FIGS. 3 and 4, showing example alignment of the metal-1 layer 106 and moat region 410 shown in FIG. 4 relative to the memory layer 104 shown in FIG. 3. The overlay view 500 shows multiple contact vias 510 and 520 that are each positioned proximate a periphery of a corresponding memory cell 260. The contact vias 510 and 520 are shared body contacts for the PMOS and NMOS, respectively, of adjacent memory cells 260. In other words, each contact via 510 can be shared by at least two adjacent memory cells 260 and their corresponding pixels 118; and each contact via 520 can be shared by at least two adjacent memory cells 260 and their corresponding pixels 118. The sharing of contact vias 510 enables the transmission of electrical signals through shared via 520 to or from adjacent memory cells simultaneously. For example, such an arrangement may facilitate providing BSA 240 signals to at least two adjacent pixels 118 simultaneously. In addition, such an arrangement may facilitate providing Vss signals to at least two adjacent memory cells 260 and their corresponding pixels 118 simultaneously.

Figure 6:
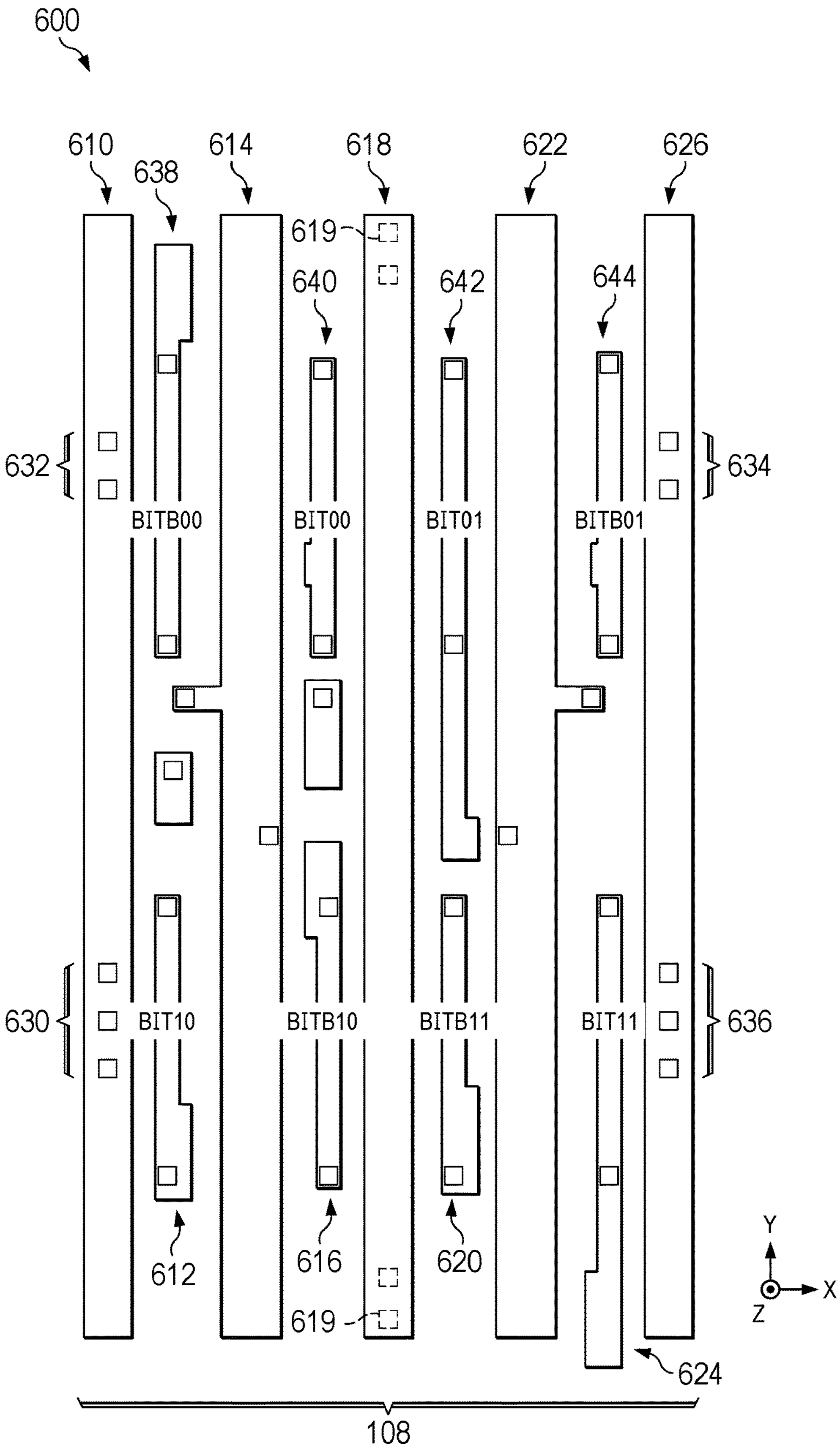
FIG. 6 is a view of a portion of a metal-2 layer of the SLM device of FIG. 1A.
Figure 7:
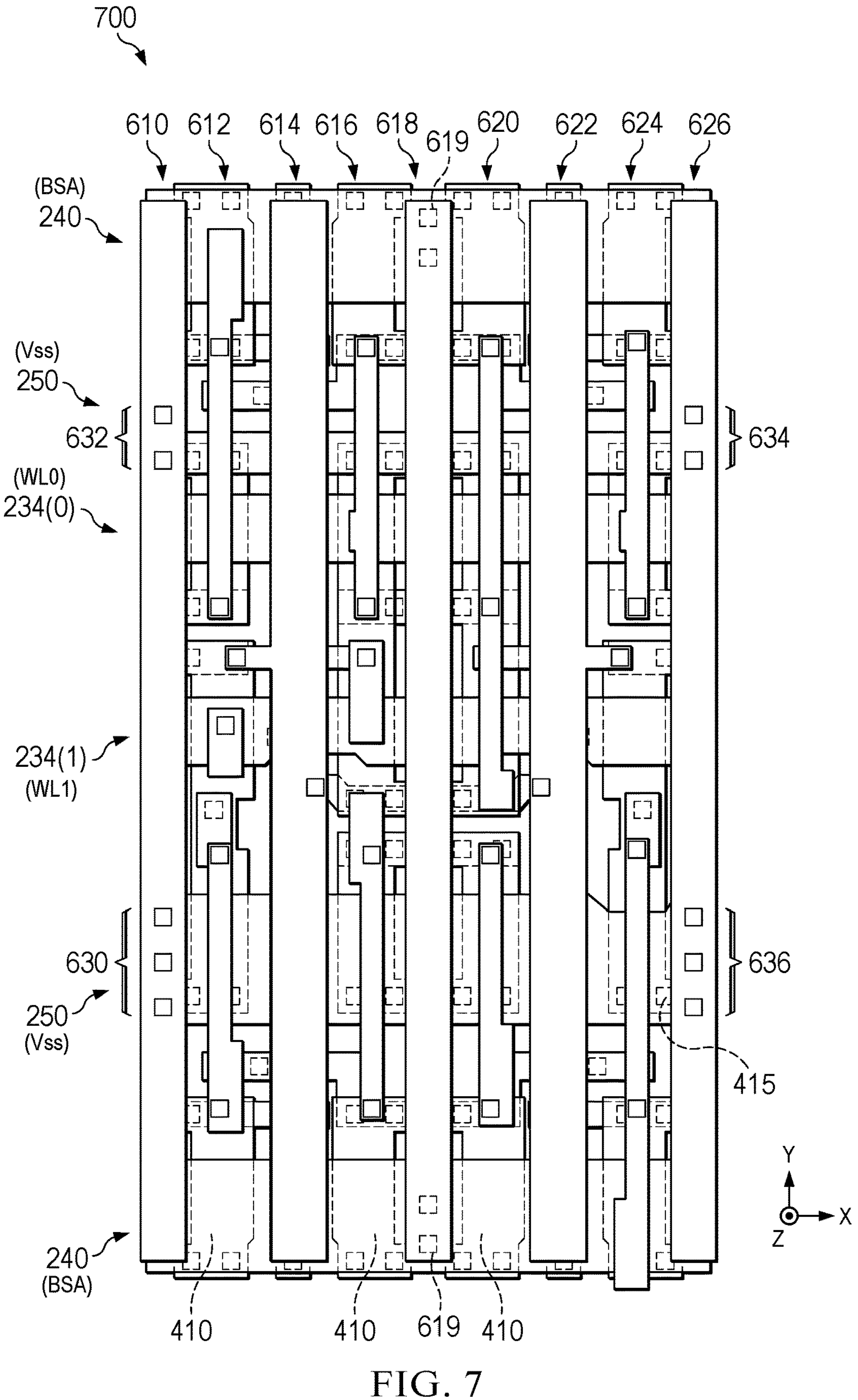
FIG. 7 is an overlay view showing example alignment of the metal-1 layer shown in FIG. 4 relative to the metal-2 layer shown in FIG. 6.

FIG. 6 is a view 600 of a portion of metal-2 layer 108. Metal-2 layer 108 is over metal-1 layer 106 and moat region 410 shown in view 400 of FIG. 4. The illustrated portion of metal-2 layer 108 includes multiple metallic lines 610-626 that are aligned parallel to the y-axis shown.

Metallic line 610 includes conductive vias 630 and 632 that provide an electrical connection to underlying line supplying Vss 250 in metal-1 layer 106, such that metallic line 610 provides an electrical interconnection between the two horizontally-aligned lines supplying Vss 250 shown in view 400 of FIG. 4. Similarly, metallic line 626 includes conductive vias 634 and 636 that provide an electrical connection to underlying lines supplying Vss 250 in metal-1 layer 106, such that metallic line 626 provides an electrical interconnection between the two horizontally-aligned lines supplying Vss 250 shown in view 400 of FIG. 4.

Metallic line 618 has vias 619 extending inwardly therefrom providing an electrical interconnection to BSA 240. Metallic line 614 provides a conductive path of a bit-line (e.g., BL0). Metallic line 622 provides a conductive path of another bit-line (e.g., BL1). The routing for metallic lines 614, 618, and 622 can be placed in a way to minimize routing between pixels 118. As shown in FIG. 6, for example, metal-2 layer 108 has patterns that position the majority of metallic lines 614, 618, and 622 beneath pixels 118, in which the patterns are aligned on a grid that is at an angle relative to the alignment of gaps between pixels). The minimizing of routing between pixels 118 can improve contrast achieved in certain display applications of spatial light modulator device 100.

BIT00 640, BIT01 642, BIT10 612, and BIT11 624 provide conductive paths for transmitting bit data signals to corresponding pixel 118. The bit data signals may be used to control the operation of a corresponding pixel 118 (e.g., whether the pixel should be in an on or off state). Each BIT 612/624640/642 includes two respective vias providing electrical interconnections with moat region 410, thereby providing a conductive path that may be used to transmit electrical signals (e.g., from a corresponding memory cell 260). For example, each BIT 612/624640/642 may be connected to a corresponding latch node 204 of a respective 5T memory cell 260.

BITB00 638, BITB01 644, BITB10 616, and BITB11 620 provide conductive paths for transmitting respective bit-b data signals to corresponding pixel 118. The bit-b data signals may be used (e.g., in cooperation with the data signals provided by a respective one of BIT00 640, BIT01 642, BIT10 612, and BIT11 to control the operation of a corresponding pixel 118 (e.g., whether the pixel should be in an on or off state). Each BITB 616/620/638/644 includes two respective vias providing electrical interconnections with moat region 410, thereby providing a conductive path that may be used to transmit electrical signals (e.g., from a corresponding memory cell 260). For example, each BITB 616/620/638/644 may be connected to corresponding latch node 206 of a 5T memory cell 260, which is on the other side of the cross-coupled inventor that forms the SRAM memory cell 260.

Each BITB 616/620/638/644 may be the complement of a corresponding BIT 612/624/640/642. For example, if a given BIT 612/624/640/642 is high (i.e. 1.8V or 10V depending on BSA state, where the memory cell 260 holds a "1" value), then the corresponding BITB 616/620/638/644 is low (0V). Conversely, if a given BIT 612/624/640/642 is low (i.e. 0V, where the memory cell 260 holds a "0" value), then the corresponding BITB 616/620/638/644 is high (1.8V or 10V). From the perspective of pixel 118 (0,0), for example, BIT00 640 and BITB00 638 are each electrically connected to a respective address electrode pad 912, with one address electrode pad 912 corresponding to an OFF state and the other corresponding to an ON state.

FIG. 7 is an overlay view 700 of FIGS. 4 and 6, showing example alignment of the portion of metal-1 layer 106 shown in FIG. 4 relative to the portion of metal-2 layer 108 shown in FIG. 6. In this example, each memory cell 260 has at least six types of electrical connections to control circuitry: (1) BIT 614/622; (2) word-line(s) 234; (3) BSA 240, (4) Vss 250, (5) BIT 612/624/640/642, and (6) BITB 616/620/638/644.

Figure 8:
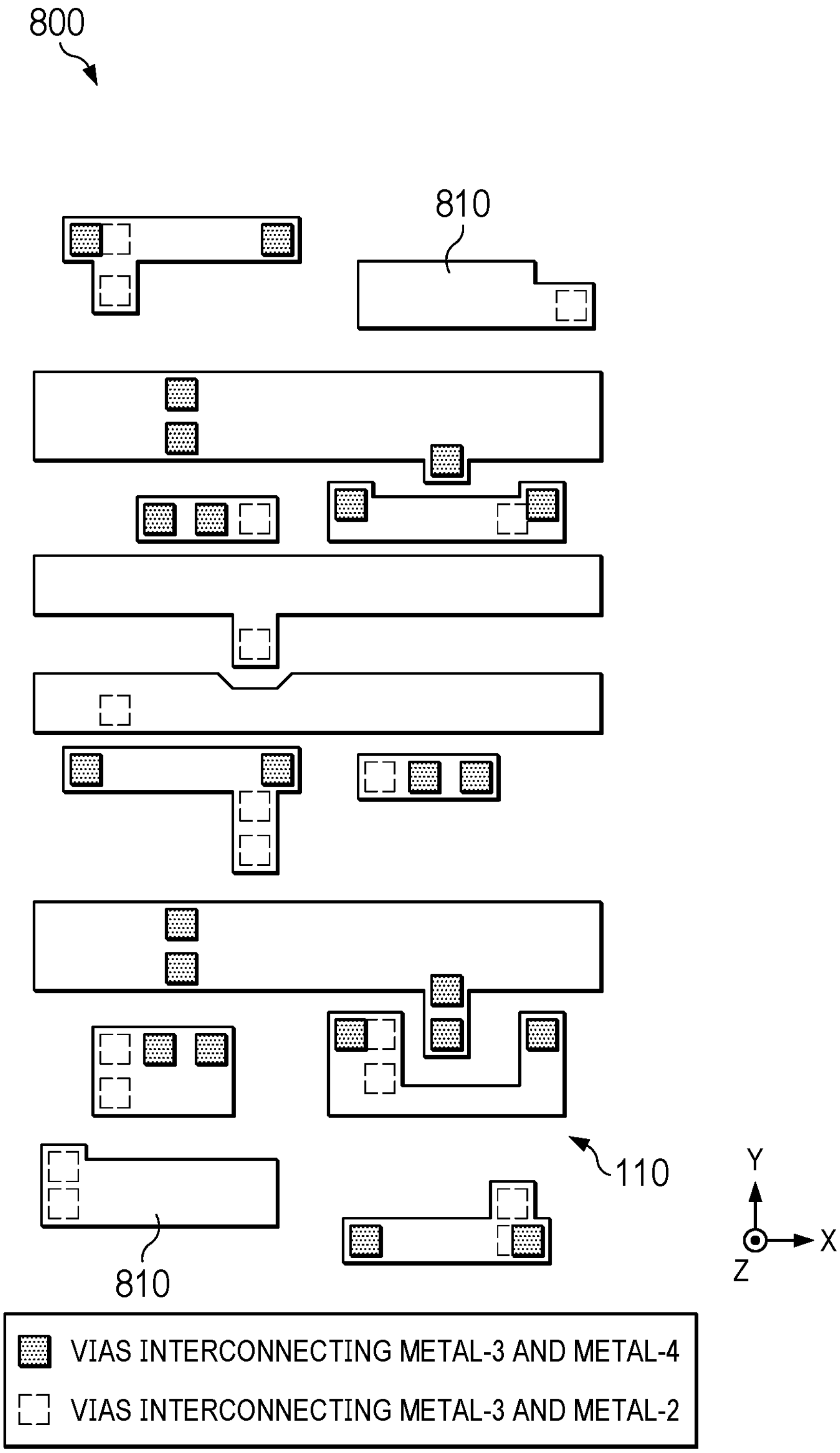
FIG. 8 is a view of a portion of the metal-3 layer of the SLM device of FIG. 1A.

FIG. 8 is a view 800 of a portion of metal-3 layer 110. Metal-3 layer 110 is over metal-2 layer 108 shown in view 600 of FIG. 6. The illustrated portion of metal-3 layer 110 includes multiple horizontally-aligned (i.e., parallel to the x-axis shown) metallic lines. View 800 further shows a first set of vias (illustrated in FIG. 8 without internal shading) electrically interconnecting patterns of metal-3 layer 110 to underlying patterns of metal-2 layer 108, and a second set of vias (illustrated in FIG. 8 with internal shading) electrically interconnecting patterns of metal-3 layer 110 to overlaying patterns of metal-4 layer 112. Metal-3 layer 110 serves as an outermost conductive routing layer over which micromechanical superstructure layers 112-116 may be formed. To fill in what would otherwise be spatial gaps in metal-3 layer 110, metal-3 layer 110 may include certain dummy metal features 810 having vias electrically connected to Vss 250 (e.g., grounded). The filling in of spatial gaps in metal-3 layer with dummy metal features 810 can enhance the planarity achieved in forming overlying superstructure layers 112-116, which may enhance reliability and operation performance of SLM device 100.

Figure 9:
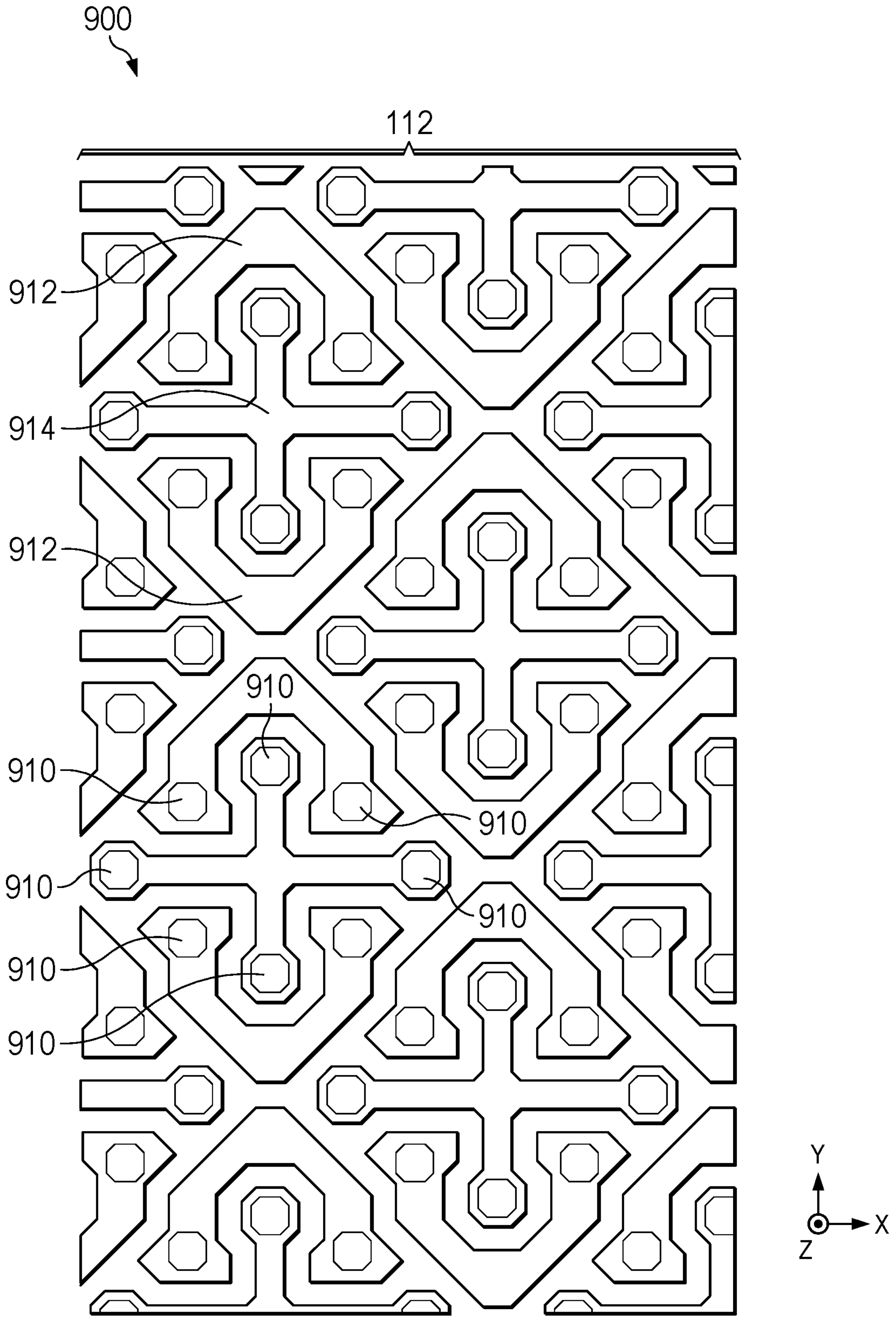
FIG. 9 is a view of a portion of the metal-4 layer of the SLM device of FIG. 1A.
Figure 11:
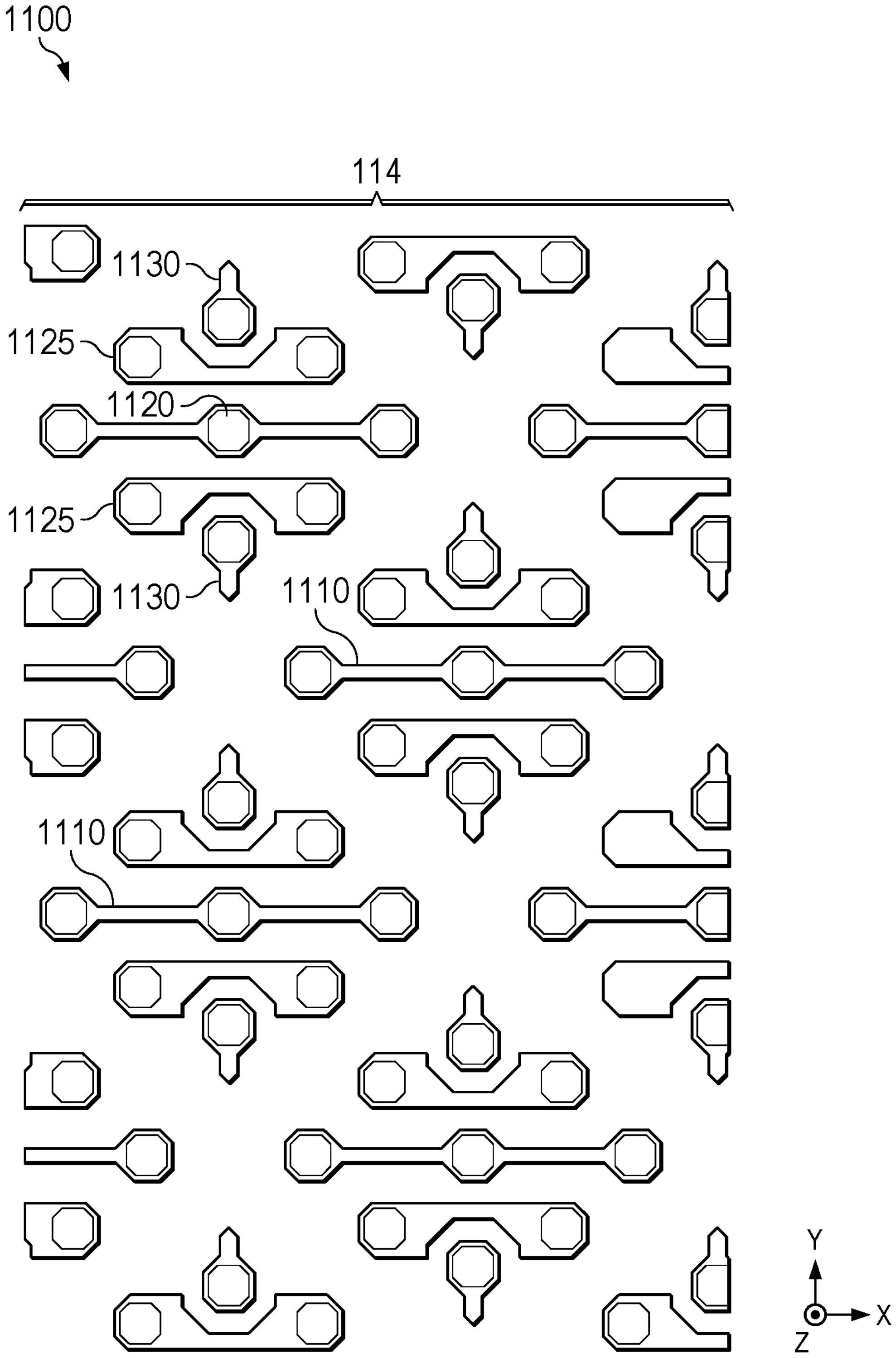
FIG. 11 is a view of a portion of a hinge layer of the SLM device of FIG. 1A.

FIG. 9 is a view 900 of a portion of metal-4 layer 112. Metal-4 layer 112 is over metal-3 layer 110 shown in view 800 of FIG. 8. Metal-4 layer provides a base superstructure layer with metallic features upon which hinge layer 114 may be formed. For each pixel, metal-4 layer 112 has six respective octagons at locations 910 indicating where respective conductive hinge posts of hinge layer 114 can be formed on metal-4 layer 112. Metal-4 layer 112 is also patterned such that each pixel 118 has two address electrode pads 912 upon which respective raised address electrodes 1125 can be formed (as shown in FIG. 11). In addition, metal-4 layer 112 is patterned such that each pixel includes a cross-shaped hinge pad 914, with a first portion extending parallel to the x-axis and a second portion extending parallel to the y-axis. Each hinge pad 914 provides a planar base surface upon which hinge 1110 of hinge layer 114 can be formed (as shown more clearly in FIG. 1B and FIG. 11). In addition, hinge pad 914 and the hinge posts formed thereon (at locations 910) electrically couple together the corresponding hinge 1110 and spring tips 1130 formed in hinge layer 114.

Figure 10:
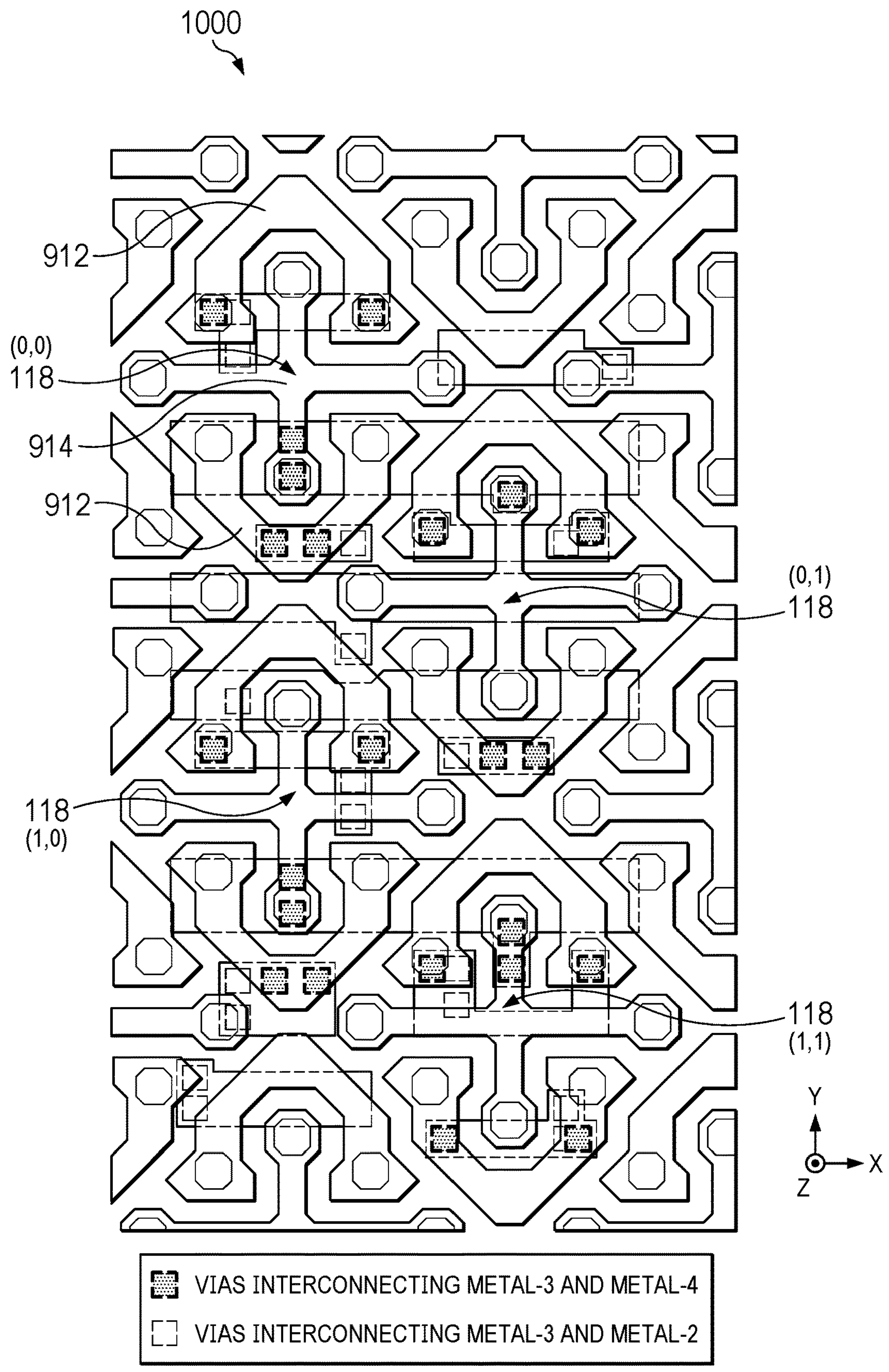
FIG. 10 is an overlay view showing example alignment of the metal-4 layer shown in FIG. 9 relative to the metal-3 layer shown in FIG. 8.

FIG. 10 is an overlay view 1000 of FIGS. 8 and 9, showing example alignment of the portion of metal-4 layer 112 shown in FIG. 9 relative to the portion of metal-3 layer 110 shown in FIG. 8. As described above with reference to FIG. 8, metal-4 layer 112 includes a set of vias (illustrated in FIGS. 8 and 10 with shading) electrically interconnecting corresponding patterns of metal-4 layer 112 to underlying patterns of metal-3 layer 110. Metal-3 layer 110 includes a set of vias (illustrated in FIGS. 8 and 10 without shading)

electrically interconnecting corresponding patterns of metal-3 layer 110 to underlying patterns of metal-2 layer 108.

As shown more clearly in FIG. 10, each address electrode pad 912 of metal-4 layer 112 has a respective pair of vias interconnecting the address electrode pad 912 to a corresponding underlying pattern of matal-3. The distance between each via of a via pair may vary from one address electrode pad 912 to another or from one pixel 118 to another. For example, FIG. 10 shows the pair of vias connected to an upper address electrode pad 912 as being closer together relative to the pair of vias connected to a lower address electrode address pad 912 of the same pixel. In addition, FIG. 10 shows the pair of vias connected to the lower address pad 912 of pixel 118 (1,1) as being further apart than the pair of vias connected to the lower address electrode pad 912 of pixel 118 (0,0).

FIG. 11 is a view 1100 of a portion of hinge layer 114. Hinge layer 114 is over metal-4 layer 112 shown in view 900 of FIG. 9. Hinge layer 114 and metal-4 layer 112 are electrically interconnected by vias positioned at location 910, with those interconnecting vias collectively providing support structure that enables the separation of respective patterns of hinge layer 114 and metal-4 layer 112 by an air gap. Hinge layer 114 provides each pixel 118 with a respective hinge 1110 suspended over metal-4 layer 112. Hinge layer 114 also provides each pixel 118 with a pair of raised address electrodes 1125 positioned on opposite sides of the hinge 1110. Each hinge 1110 is configured to allow the pixel 118 to move responsive to electrostatic potential between an attached micromirror and the raised address electrodes 1125. Hinge layer also provides each pixel 118 with a pair of spring tips 1130 configured to facilitate movement of the pixel 118, including in its transition from one state to another (e.g., from an on state to an off state and vice versa).

The hinges 1100 of hinge layer 114 each includes a pad 1120 at the center thereof, which is sufficient in size to support a mirror post 119 of mirror layer. The mirror post 119 provides an electrical interconnection between the connected hinge 1110 and micromirror of a pixel 118. The mirror post also provides sufficient support structure to separate a given micromirror from its hinge 1110 by an air gap. Collectively, the mirror post 119 and the hinge posts at locations 910 provide part of a conductive path to hinge pads 914, which are each electrically interconnected to supply voltage Vss. Thus, a supply voltage Vss can be supplied to each micromirror of all pixels 118 to effect the generation of electrostatic potential sufficient to control the movement of pixels 118.

Figure 12:
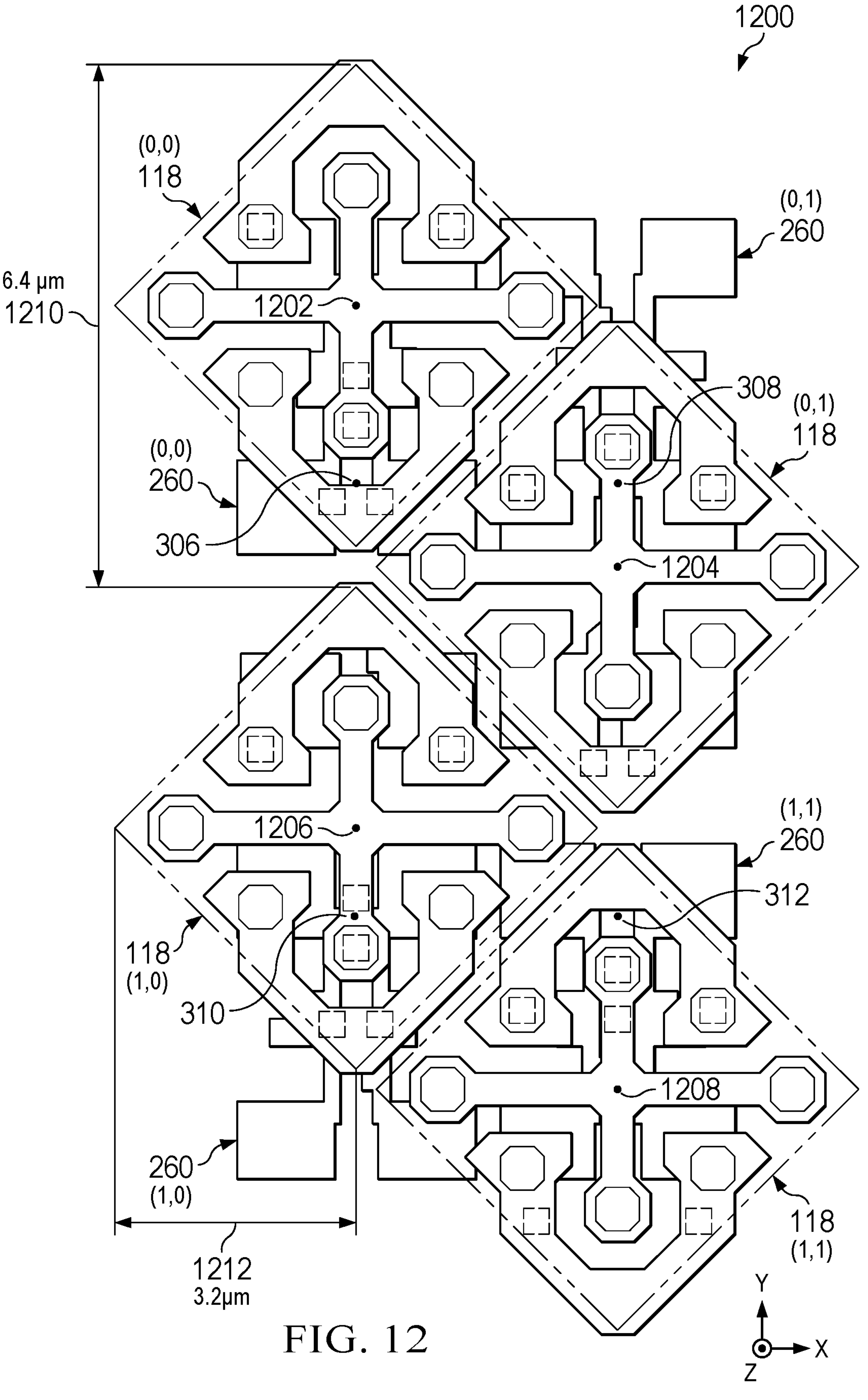
FIG. 12 is an overlay view showing example alignment of the metal-4 layer shown in FIG. 9 relative to the memory layer shown in FIG. 3, together with the corresponding relative alignment of the micromirror portion of pixels formed in the mirror layer of the SLM device of FIG. 1A.

FIG. 12 is an overlay view 1200 of FIGS. 9 and 3, showing example alignment of the portion of metal-4 layer 112 shown in FIG. 9 relative to the portion of memory layer 104 shown in FIG. 3, together with the corresponding relative alignment of the micromirror portion of pixels 118, as formed in mirror layer 116. In some examples, there is a one-to-one ratio of a number of memory cells 260 in the array of memory cells 260 and a number of pixels 118 in the array of array of pixels 118, such that each pixel 118 has one corresponding memory cell 260 dedicated to that pixel 118.

View 1200 shows a 2×2 array of pixels 118, in which each pixel 118 is represented by a respective one of four array coordinates (0,0), (1,0), (0,1), and (1,1), with coordinate (0,0) being in the upper-leftmost array position from the perspective of view 1200. Each one of the four illustrated pixels 118 (0,0), 118 (0,1), 118 (1,0), 118 (1,1) is positioned on a diamond pattern relative to the peripheral edges of the 2×2 array, such that the peripheral edges of each pixel 118 are at an angle (e.g., +45° angle) relative to the grid pattern of memory layer 104, which has memory cells 260 aligned in orthogonal rows and columns. Each pixel 118 (0,0), 118 (0,1), 118 (1,0), 118 (1,1) is electrically connected to a output of a respective underlying memory cell 260 (0,0), 260 (0,1), 260 (1,0), 260 (1,1), thereby enabling each memory cell 260 (0,0), 260 (0,1), 260 (1,0), 260 (1,1) to control the operation of its electrically coupled pixel 118 (0,0), 118 (0,1), 118 (1,0), 118 (1,1), respectively, on a one-to-one basis.

As shown in FIG. 12, each pixel 118 of the 2×2 array of pixels 118 overlaps respective portions of at least two adjacent memory cells 260 of the corresponding 2×2 array of memory cells 260. For example, pixel 118 (1,0) overlaps respective portions of both memory cell 260 (0,0) (including at least a portion of transistor NW00) and memory cell 260 (1,0) (including at least respective portions of transistors NW10, NB10, and N10). In addition, pixel 118 (1,0) overlaps a portion of memory cell 260 (1,1) (including at least a portion of transistor N11). As another example, pixel 118 (0,1) overlaps respective portions of both memory cell 260 (1,1) (including at least a portion of transistor NW11) and memory cell 260 (0,1) (including at least respective portions of transistors NW01, NB01, and N01). In addition, pixel 118 (0,1) overlaps a portion of memory cell 260 (0,0) (including at least a portion of transistor N00).

As another example, FIG. 12 shows pixel 118 (0,0) as overlapping respective portions of at least memory cells 260 (0,0) and memory cell 260 (0,1). Similarly, pixel 118 (1,1) is shown as overlapping respective portions of at least memory cells 260 (1,1) and 260 (1,0). Thus, in the example shown in FIG. 12, each pixel 118 overlaps respective portions of at least two (and in some cases at least three) adjacent memory cells 260 of the corresponding 2×2 array of memory cells 260.

A column pitch 1212 (measuring the horizontal distance between like features of adjacent pixels) is shown in FIG. 12 as being 3.2 microns in this example. However, any suitable column pitch 1212 may be used, such as, for example, a column pitch 1212 within the range of 3.0 to 4.5 microns. A row pitch 1210 (measuring the vertical distance between like features of adjacent pixels) is shown in FIG. 12 as being 6.4 microns in this example. However, any suitable column pitch 1212 may be used, such as, for example, a column pitch 1212 within the range of 6.0 to 8.0 microns. In some examples, such as the example diamond arrangement of square pixels shown in FIG. 12, the column pitch is half that of the row pitch. Other examples may use different shaped pixels having different column or row pitches or different ratios of pitches between columns and rows.

As explained further with reference to FIGS. 13-16, the center of each pixel 118 is positionally offset from the center of its corresponding underlying memory cell 260, such that the respective centers are not perfectly aligned to one another. In instances where the outermost boundary of a feature of pixel 118 (e.g., its light-facing micromirror) is not rotationally symmetric, the "center" of the pixel 118 as that term is used herein refers to the intersection of the two lines bisecting the width and length of the smallest rectangle that can be drawn that completely frames the pixel 118. In instances where a pixel 118 is rotationally symmetric in terms of its light-facing element, such as a light-facing micromirror, the "center" of the pixel 118 is defined herein as being the rotational center. Thus, for the pixels 118 shown in FIG. 12, the rotational center of a given pixel 118 is the middle point of the square micromirror, in which pixel 118

(0,0) has center point 1202, pixel 118 (0,1) has center point 1204, pixel 118 (1,0) has center point 1206, and pixel 118 (1,1) has center point 1208.

The offset directions are staggered from pixel 118 to pixel 118, such that adjacent pixels along a diagonal (i.e., adjacent pixels having sides opposing one another) will have differing respective offsets (e.g., a first pixel 118 has an offset in a first direction and an adjacent second pixel 118 has a different offset in a second direction opposite the first direction). As shown in FIG. 12, for example, pixel 118 (0,0) as a center point 1202 that is offset in a positive direction parallel to the y-axis relative to the center point 306 of its corresponding memory cell 260 (0,0); pixel 118 (0,1) has a center point 1204 that is offset in a negative direction parallel y-axis relative to the center point 308 of its corresponding memory cell 260 (0,1); pixel 118 (1,0) has a center point 1206 that is offset in a positive direction parallel y-axis relative to the center point 310 of its corresponding memory cell 260 (1,0); and pixel 118 (1,1) has a center point 1208 that is offset in a negative direction parallel y-axis relative to the center point 312 of its corresponding memory cell 260 (1,1).

The use of varying offset between adjacent pixels 118 and their respective memory cells 260, as shown by way of example in FIG. 12, may facilitate the accommodation of a smaller row or column pitches for an array of pixels and hence a higher pixel density for spatial light modulator device 100, while allowing sufficient space for memory cells 260 to accommodate high-voltage transistors Q1-Q5. In addition, the use of varying offsets from pixel 118 to pixel 118 may optimize the use of a diamond pattern for pixels 118 relative to an underlying grid pattern for memory cells 260.

Figure 13:
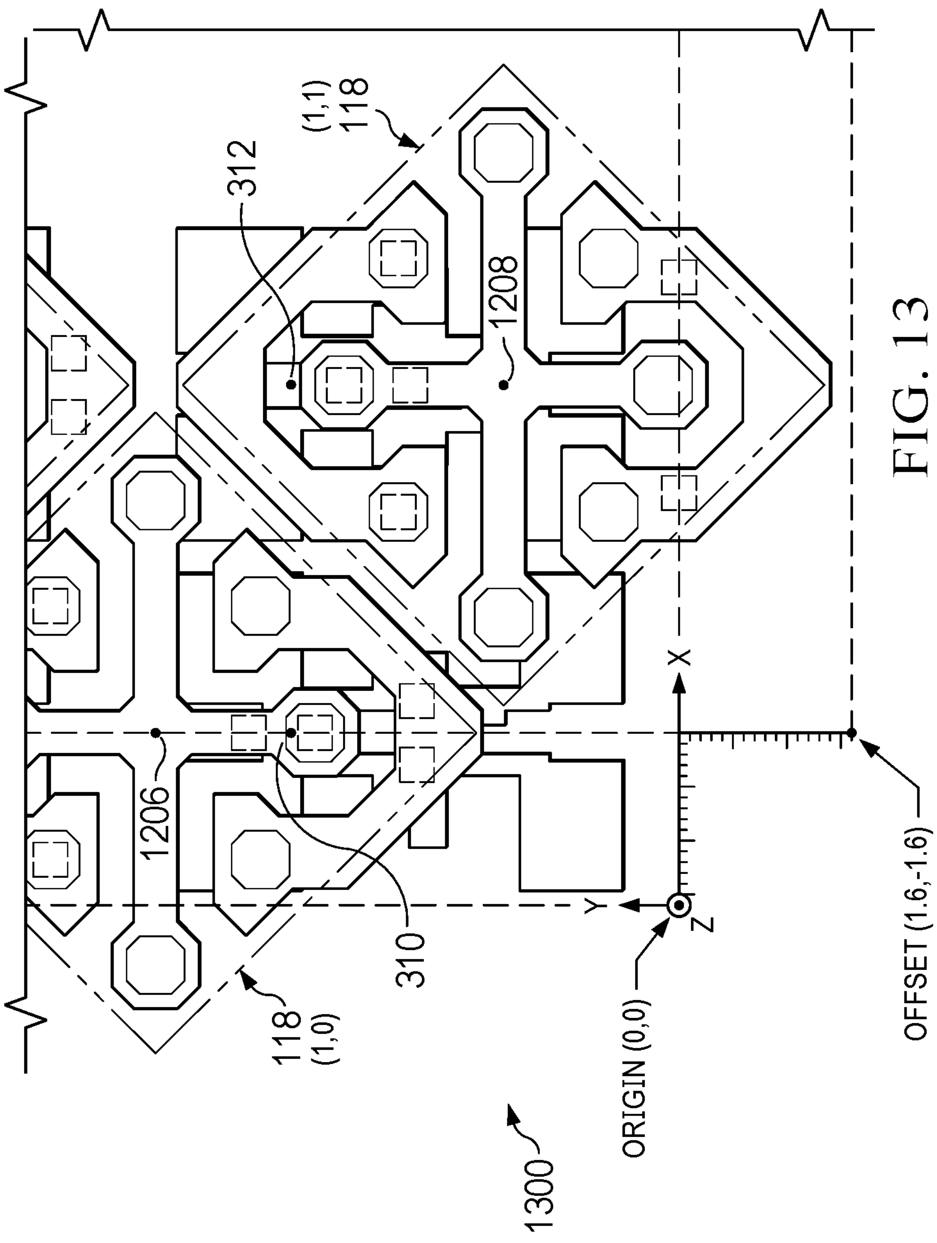
FIG. 13 is a view of an example offset of a first pixel of a two-by-two (2×2) array of pixels, relative to its corresponding memory cell of an underlying memory layer.

FIG. 13 is a view 1300 of an example offset of a first pixel 118 (1,1) from an origin point (0,0) located at the bottom left corner of a rectangle or square fully framing the 2×2 array of memory cells 260 shown in FIG. 3. The offset of pixel 118 (1,1) can be measured as the cartesian distance (e.g., as measured in microns) from the origin point (0,0) to the bottom-left corner of a rectangle or square fully framing pixel 118 (1,1), which may be represented as (1.6,−1.6), where 1.6 is the distance from the origin point (0,0) in the positive direction of the illustrated x-axis, and −1.6 is the distance from the origin point (0,0) in the negative direction of the illustrated y-axis. For pixel 118 (1,1), the coordinate used to evaluate such an offset is collocated with the center of a pixel 118 diagonally adjacent to pixel 118 (1,1). Layers 106-116 collectively provide electrical interconnection between pixel 118 (1,1) and its corresponding memory cell 260 (1,1), such that memory cell 260 (1,1) is operable to provide binary data used to control a display state of pixel 118 (1,1).

Figure 14:
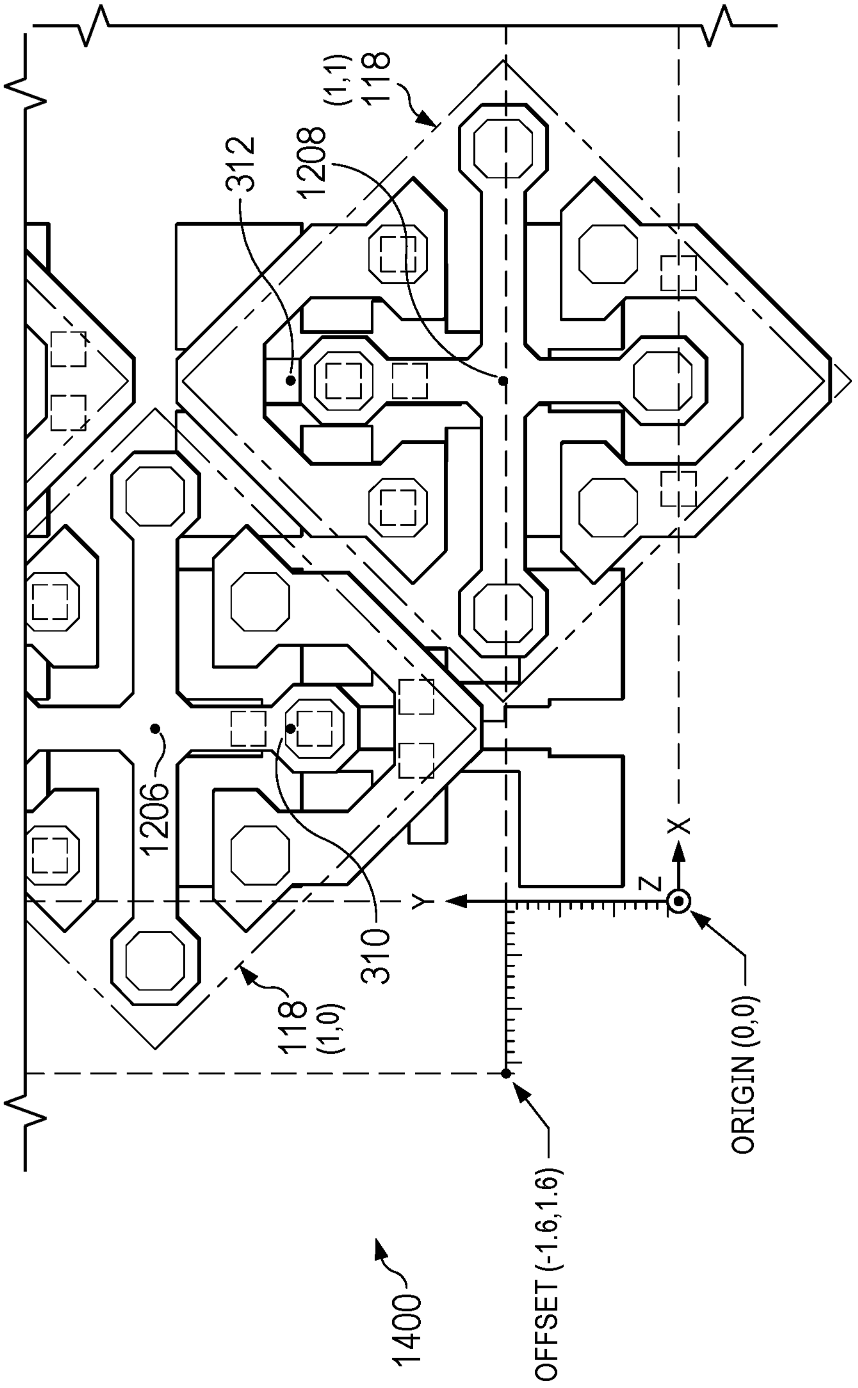
FIG. 14 is a view of an example offset of a second pixel of a 2×2 array of pixels, relative to its memory cell of an underlying memory layer.

FIG. 14 is a view 1400 of an example offset of a second pixel 118 (1,0) from the same origin point (0,0) referenced in FIG. 13, which is located at the bottom left corner of a rectangle or square fully framing the 2×2 array of memory cells 260 shown in FIG. 3. The offset of pixel 118 (1,0) can be measured as the cartesian distance from the origin point (0,0) to the bottom-left corner of a rectangle or square fully framing pixel 118 (1,0), which may be represented as (−1.6, 1.6), where −1.6 is the distance from the origin point (0,0) in the negative direction of the illustrated x-axis, and 1.6 is the distance from the origin point (0,0) in the positive direction of the illustrated y-axis. For pixel 118 (1,0), the coordinate used to evaluate such an offset is collocated with the center of a pixel 118 diagonally adjacent to pixel 118 (1,0). Layers 106-116 collectively provide electrical interconnection between pixel 118 (1,0) and its corresponding memory cell 260 (1,0), such that memory cell 260 (1,0) is operable to provide binary data used to control a display state of pixel 118 (1,0).

Figure 15:
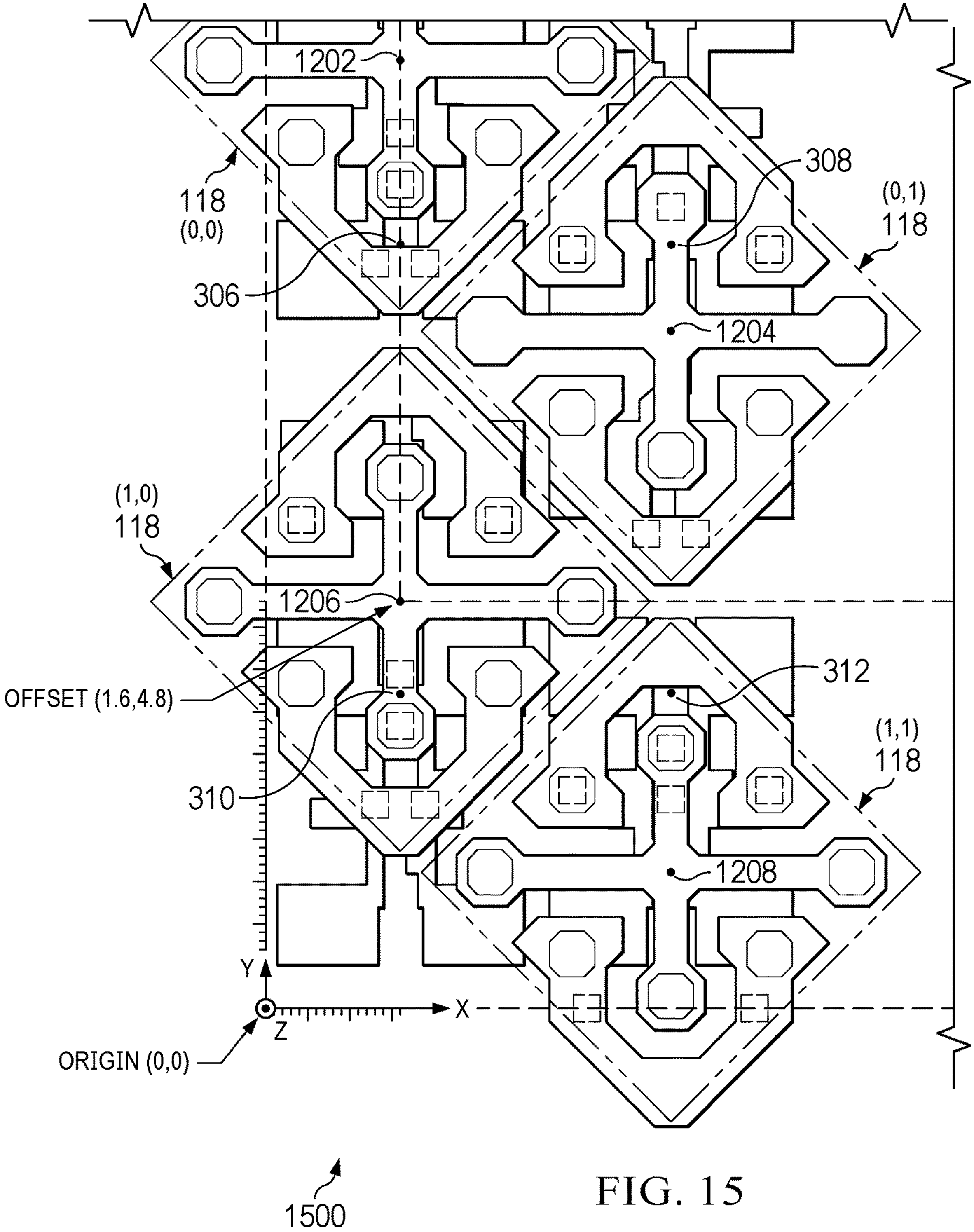
FIG. 15 is a view of an example offset of a third pixel of a 2×2 array of pixels, relative to its memory cell of an underlying memory layer.

FIG. 15 is a view 1500 of an example offset of a third pixel 118 (0,1) from the same origin point (0,0) referenced in FIG. 13, which is located at the bottom left corner of a rectangle or square fully framing the 2×2 array of memory cells 260 shown in FIG. 3. The offset of pixel 118 (0,1) can be measured as the cartesian distance from the origin point (0,0) to the bottom-left corner of a rectangle or square fully framing pixel 118 (0,1), which may be represented as (1.6, 4.8), where 1.6 is the distance from the origin point (0,0) in the positive direction of the illustrated x-axis, and 4.8 is the distance from the origin point (0,0) in the positive direction of the illustrated y-axis. For pixel 118 (0,1), the coordinate used to evaluate such an offset is collocated with the center of a pixel 118 diagonally adjacent to pixel 118 (0,1). Layers 106-116 collectively provide electrical interconnection between pixel 118 (0,1) and its corresponding memory cell 260 (0,1), such that memory cell 260 (0,1) is operable to provide binary data used to control a display state of pixel 118 (0,1).

Figure 16:
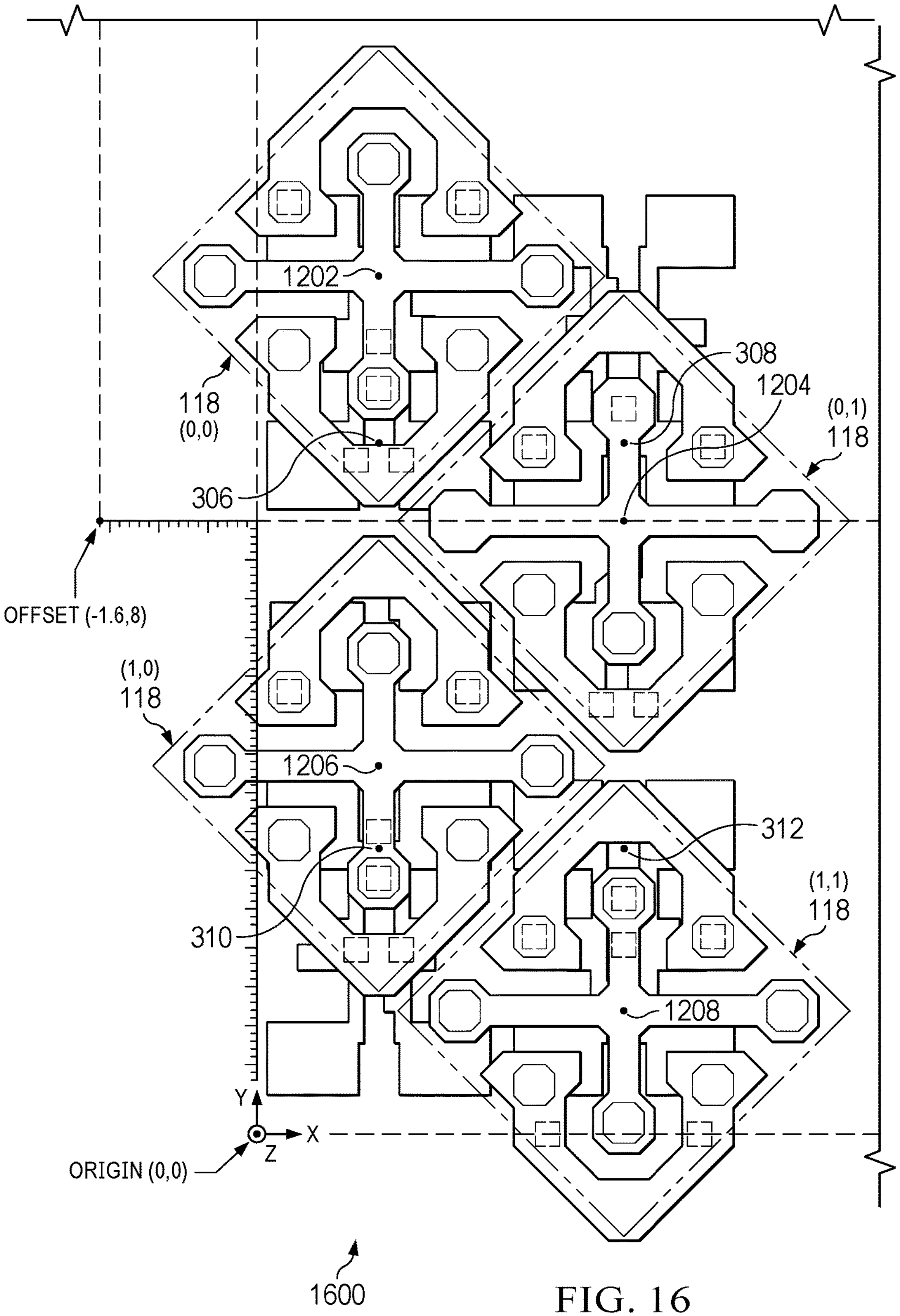
FIG. 16 is a view of an example offset of a fourth pixel of a 2×2 array of pixels, relative to its memory cell of an underlying memory layer.

FIG. 16 is a view 1600 of an example offset of a fourth pixel 118 (0,0) from the same origin point (0,0) referenced in FIG. 13, which is located at the bottom left corner of a rectangle or square fully framing the 2×2 array of memory cells 260 shown in FIG. 3. The offset of pixel 118 (0,0) can be measured as the cartesian distance from the origin point (0,0) to the bottom-left corner of a rectangle or square fully framing pixel 118 (0,0), which may be represented as (−1.6, 8.0), where −1.6 is the distance from the origin point (0,0) in the negative direction of the illustrated x-axis, and 8.0 is the distance from the origin point (0,0) in the positive direction of the illustrated y-axis. For pixel 118 (0,0), the coordinate used to evaluate such an offset is collocated with the center of a pixel 118 diagonally adjacent to pixel 118 (0,0). Layers 106-116 collectively provide electrical interconnection between pixel 118 (0,0) and its corresponding memory cell 260 (0,0), such that memory cell 260 (0,0) is operable to provide binary data used to control a display state of pixel 118 (0,0).

The respective offsets of pixels 118 in a n×n array from a common reference can be mathematically represented by the relative cartesian coordinates:

$$\left(M*\frac{\pm\sqrt{2}}{4}=X,\ M*\frac{\pm\sqrt{2}}{4}=Y\right),$$

where M is the "pixel edge pitch," defined herein as the length of the longest edge of a given pixel 118 (or any given edge if the pixel 118 is perfectly square). If the pixel edge pitch for pixel 118 (1,1) is 4.525 micrometers (μm), for example, the offset for pixel 118 (1,1) relative to an origin reference point (0,0) for the example 2×2 array of FIGS. 13-16 can be represented as:

$$\left(4.525\ \mu m*\frac{\sqrt{2}}{4},\ 4.525\ \mu m*\frac{-\sqrt{2}}{4}\right)\text{ or }(1.6\ \mu m,\ -1.6\ \mu m).$$

The offset for the diagonally adjacent pixel 118 (1,0) of the same pixel pitch, relative to the same origin reference point (0,0), can be represented as:

$$\left(4.525\ \mu m * \frac{-\sqrt{2}}{4},\ 4.525\ \mu m * \frac{\sqrt{2}}{4}\right) \text{ or } (-1.6\ \mu m,\ 1.6\ \mu m).$$

Pixels 118 (0,1) and 118 (1,0) have respective offsets that are further from the origin (0,0) in the positing direction of the y-axis. This additional offset can be expressed as an odd-number integer multiplier. For example, the offset for the diagonally adjacent pixel 118 (0,1) of the same pixel pitch, relative to the same origin reference point (0,0), can be represented as:

$$\left(4.525\ \mu m * \frac{\sqrt{2}}{4},\ 3 * 4.525\ \mu m * \frac{\sqrt{2}}{4}\right) \text{ or } (1.6\ \mu m,\ 4.8\ \mu m).$$

The offset for the diagonally adjacent pixel 118 (0,0) of the same pixel pitch, relative to the same origin reference point (0,0), can be represented as:

$$\left(4.525\ \mu m * \frac{-\sqrt{2}}{4},\ 5 * 4.525\ \mu m * \frac{\sqrt{2}}{4}\right) \text{ or } (-1.6\ \mu m,\ 8.0\ \mu m).$$

As shown by the examples above, offsets differences as small as 1.6 μm in a given cartesian direction, or offsets differences as large as 9.6 μm in a given cartesian direction, may be sufficient to achieve certain technical advantages described herein.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context. To aid the Patent Office, and any readers of any patent issued on this application, in interpreting the claims appended hereto, applicant notes that there is no intention that any of the appended claims invoke 35 U.S.C. § 112 (f) as it exists on the date of filing hereof unless the words "means for" or "step for" are explicitly used in the claim language.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples may be included in an integrated circuit and other elements may be external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

In this description, unless otherwise stated, "about," "approximately" or "substantially" preceding a parameter means being within +/−10 percent of that parameter or, if the parameter is zero, a reasonable range of values around zero.

In the foregoing descriptions, for purposes of explanation, numerous specific details are set forth to provide a thorough understanding of one or more examples. However, this disclosure may be practiced without some or all these specific details, as will be evident to one having ordinary skill in the art. In other instances, well-known process steps or structures have not been described in detail in order not to unnecessarily obscure this disclosure. In addition, while the disclosure is described in conjunction with example examples, this description is not intended to limit the disclosure to the described examples. To the contrary, the description is intended to cover alternatives, modifications, and equivalents as may be included within the spirit and scope of the disclosure as defined by the appended claims.

What is claimed is:

1. An apparatus comprising:

a substrate;

an array of memory cells on the substrate, the array of memory cells in a grid pattern; and an array of pixels over the array of memory cells, the array of pixels in a diamond pattern that is oriented at an angle relative to the grid pattern of the array of memory cells, each pixel of the array of pixels overlapping respective portions of at least two memory cells of the array of memory cells, each pixel of the array of pixels electrically connected to an output of a respective memory cell of the array of memory cells.

2. The apparatus of claim 1, wherein each pixel of the array of pixels shares, with a respective adjacent pixel of the array of pixels, an electrical connection to a block step address (BSA).

3. The apparatus of claim 1, wherein a first pixel of the array of pixels has a first positional offset relative to its respective memory cell of the array of memory cells, a second pixel of the array of pixels has a second positional offset relative to its respective memory cell of the array of memory cells, the first and second positional offsets being different from one another, the first and second pixels being adjacent to one another.

4. The apparatus of claim 3, wherein the first positional offset is in a first direction, and the second positional offset is in a second direction opposite the first direction.

5. The apparatus of claim 1, wherein the array of memory cells includes first, second, third, and fourth memory cells in a 2×2 array having an origin point at a corner thereof, the array of pixels includes first, second, third, and fourth pixels in a 2×2 array, the first pixel is offset from the origin point according to coordinates, $$\left(M * \frac{\sqrt{2}}{4} = X, M * \frac{-\sqrt{2}}{4} = Y\right),$$

and the second pixel is offset from the origin point according to coordinates, $$\left(M * \frac{-\sqrt{2}}{4} = X, M * \frac{\sqrt{2}}{4} = Y\right),$$

where M is an edge pitch of the first, second, third, or fourth pixel.

6. The apparatus of claim 1, wherein the angle is within 10% of a 45 degree angle.

7. The apparatus of claim 1, wherein there is a one-to-one ratio of a number of memory cells in the array of memory cells and a number of pixels in the array of array of pixels.

8. The apparatus of claim 1, wherein each memory cell of the array of memory cells is a static random access memory cell including five transistors.

9. The apparatus of claim 1, wherein each pixel of the array of pixels includes a micromirror.

10. The apparatus of claim 1, wherein each pixel of the array of pixels has a diagonal pitch less than five micrometers.

11. An apparatus comprising:

a substrate;

an array of memory cells on the substrate, the array of memory cells in a grid pattern; and an array of pixels over the array of memory cells, the array of pixels in a diamond pattern that is oriented at an angle relative to the grid pattern of the array of memory cells, each pixel of the array of pixels electrically connected to an output of a respective memory cell of the array of memory cells;

wherein a center of a first pixel of the array of pixels has a first positional offset relative to a center of its respective memory cell of the array of memory cells, a center of a second pixel of the array of pixels has a second positional offset relative to a center of its respective memory cell of the array of memory cells, and the first and second positional offsets are different from one another.

12. The apparatus of claim 11, wherein each pixel of the array of pixels shares, with a respective adjacent pixel of the array of pixels, an electrical connection to a block step address (BSA).

13. The apparatus of claim 11, wherein the first positional offset is in a first direction and the second positional offset is in a second direction opposite from the first direction, the first and second pixels being adjacent to one another.

14. The apparatus of claim 11, wherein the first and second pixels are adjacent to one another, the first positional offset is in a first direction at a distance of at least $$M * \frac{-\sqrt{2}}{4},$$

and the second positional offset is in a second direction at a distance of at least $$M * \frac{\sqrt{2}}{4},$$

where M is an pixel edge pitch of the first or second pixel, and the first and second directions are opposite one another.

15. The apparatus of claim 11, wherein each pixel of the array of pixels has a diagonal pitch less than five micrometers.

16. An apparatus comprising:

a substrate;

an array of memory cells on the substrate, the array of memory cells in a grid pattern; and an array of pixels over the array of memory cells, the array of pixels in a diamond pattern that is oriented at an angle relative to the grid pattern of the array of memory cells, each pixel of the array of pixels overlapping respective portions of at least two memory cells of the array of memory cells, each pixel of the array of pixels electrically connected to an output of a respective memory cell of the array of memory cells;

wherein a center of a first pixel of the array of pixels has a first positional offset relative to a center of its respective memory cell of the array of memory cells, a center of a second pixel of the array of pixels has a second positional offset relative to a center of its respective memory cell of the array of memory cells, the first and second positional offsets being different from one another.

17. The apparatus of claim 16, wherein each pixel of the array of pixels shares, with a respective adjacent pixel of the array of pixels, an electrical connection to a block step address.

18. The apparatus of claim 16, wherein the first positional offset is in a first direction and the second positional offset is in a second direction opposite from the first direction, the first and second pixels being adjacent to one another.

19. The apparatus of claim 16, wherein the first and second pixels are adjacent to one another, the first positional offset is in a first direction at a distance of at least $$M * \frac{-\sqrt{2}}{4},$$

and the second positional offset is in a second direction at a distance of at least $$M * \frac{\sqrt{2}}{4},$$

where M is an pixel edge pitch of the first or second pixel, and the first and second directions are opposite one another.

20. The apparatus of claim 16, wherein each pixel of the array of pixels has a diagonal pitch less than five micrometers.

* * * * *